United States Patent
Nagasawa et al.

(10) Patent No.: US 12,002,280 B2
(45) Date of Patent: Jun. 4, 2024

(54) DETECTION DEVICE AND OPTICAL FILTER

(71) Applicant: Japan Display Inc., Tokyo (JP)

(72) Inventors: Junko Nagasawa, Tokyo (JP); Shigeru Tabatake, Tokyo (JP); Tetsuya Yamamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/237,091

(22) Filed: Aug. 23, 2023

(65) Prior Publication Data

US 2023/0394867 A1     Dec. 7, 2023

Related U.S. Application Data

(63) Continuation of application No. PCT/JP2022/004392, filed on Feb. 4, 2022.

(30) Foreign Application Priority Data

Feb. 25, 2021    (JP) ................................ 2021-029149

(51) Int. Cl.
*G06V 40/13*      (2022.01)
*G06V 40/12*      (2022.01)
(Continued)

(52) U.S. Cl.
CPC .......... *G06V 40/12* (2022.01); *H01L 31/0232* (2013.01); *H10K 39/32* (2023.02)

(58) Field of Classification Search
CPC .... G06V 40/12; G06V 40/1318; H10K 39/32; G02B 5/20; G02B 5/22; G09F 9/00; H01L 27/146; H01L 31/0232
See application file for complete search history.

(56) References Cited

U.S. PATENT DOCUMENTS

2008/0090054 A1    4/2008   Koshizuka
2008/0197437 A1    8/2008   Sugimoto et al.
(Continued)

FOREIGN PATENT DOCUMENTS

JP    2008-010702 A    1/2008
JP    2008-205317 A    9/2008
(Continued)

OTHER PUBLICATIONS

International Search Report issued in International Patent Application No. PCT/JP2022/004392 on Apr. 19, 2022 and English translation of same. 7 pages.
(Continued)

*Primary Examiner* — Antonio Xavier
(74) *Attorney, Agent, or Firm* — K&L Gates LLP

(57) ABSTRACT

According to an aspect, a detection device includes: a substrate having a detection region; a plurality of photodiodes provided in the detection region; a first light-transmitting resin layer provided so as to cover the photodiodes; a light-blocking layer provided on the upper side of the first light-transmitting resin layer and provided with openings in regions overlapping the respective photodiodes; a second light-transmitting resin layer provided so as to cover the light-blocking layer; and a plurality of lenses provided on the upper side of the second light-transmitting resin layer so as to overlap the respective photodiodes. The second light-transmitting resin layer is provided so as to cover an end on a peripheral side of the light-blocking layer on a peripheral side of the substrate.

11 Claims, 21 Drawing Sheets

(51) Int. Cl.
  *H01L 31/0232* (2014.01)
  *H10K 39/32* (2023.01)

(56) References Cited

U.S. PATENT DOCUMENTS

| | | |
|---|---|---|
| 2019/0080138 A1 | 3/2019 | Gao et al. |
| 2019/0214418 A1* | 7/2019 | Sasaki ............... H01L 27/14621 |
| 2020/0301187 A1 | 9/2020 | Lin et al. |
| 2020/0381470 A1 | 12/2020 | Ho et al. |

FOREIGN PATENT DOCUMENTS

| | | |
|---|---|---|
| JP | 2015-056484 A | 3/2015 |
| JP | UP2016-015173 A | 1/2016 |

OTHER PUBLICATIONS

Written Opinion issued in International Patent Application No. PCT/JP2022/004392 on Apr. 19, 2022. 4 pages.

* cited by examiner

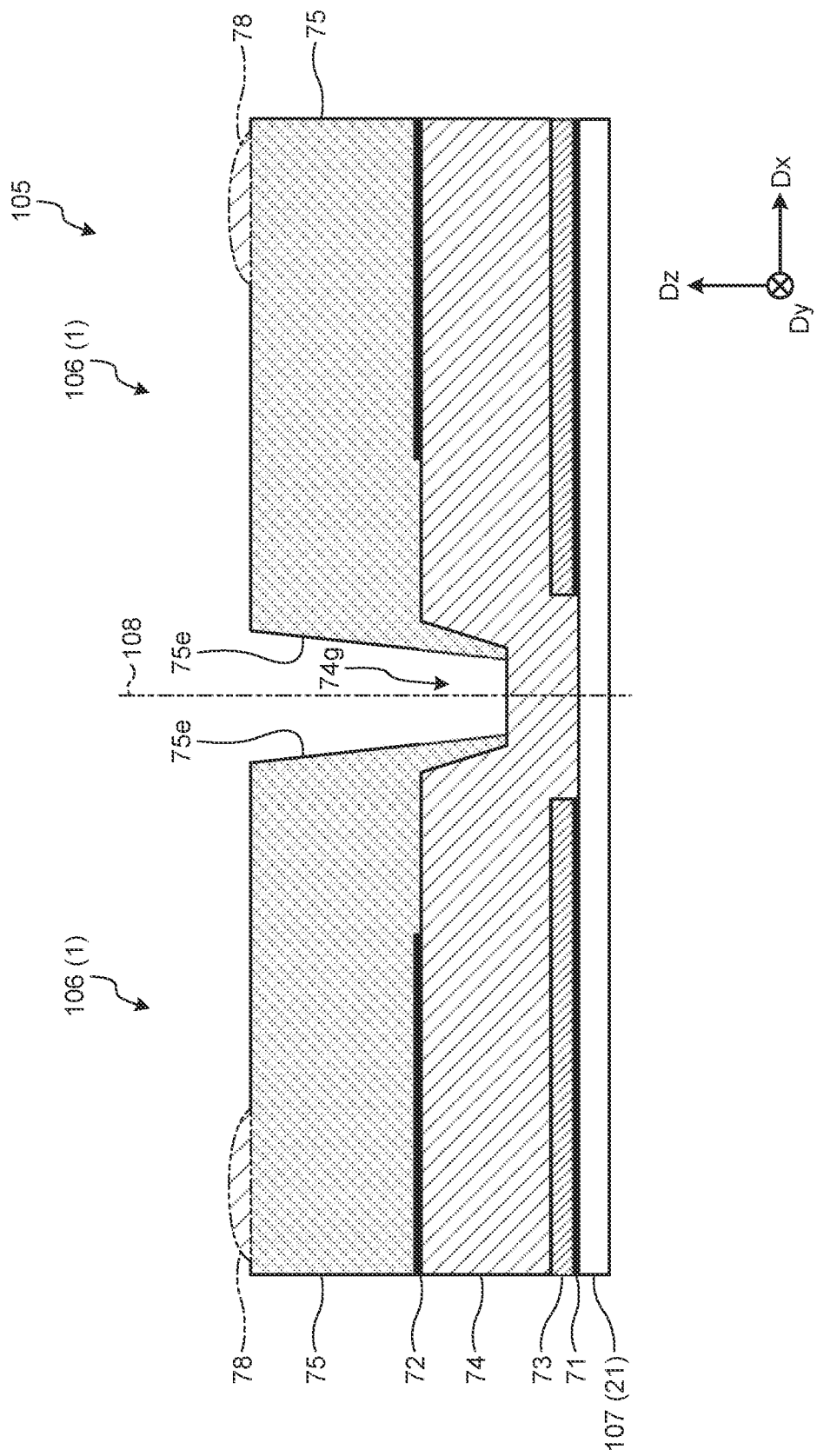

DETECTION DEVICE AND OPTICAL FILTER

CROSS-REFERENCE TO RELATED APPLICATION

This application is a continuation of International Patent Application No. PCT/JP2022/004392 filed on Feb. 4, 2022, which application claims the benefit of priority from Japanese Patent Application No. 2021-029149 filed on Feb. 25, 2021 and the entire contents of which are incorporated herein by reference.

BACKGROUND

1. Technical Field

What is disclosed herein relates to a detection device and an optical filter.

2. Description of the Related Art

United States Patent Application Publication No. 2019/0080138 describes a display panel that includes a lens array in which a plurality of lenses are arranged, an optical sensor array in which a plurality of optical sensors are arranged, and a pinhole array provided between the lens array and the optical sensor array.

In a detection device in which the pinhole array and the lens array are stacked on the optical sensor array, when, for example, a light-blocking layer and the lens are formed on a light-transmitting resin layer, a step formed at an end on the peripheral side of the light-transmitting resin layer may cause variations in shapes of the pinholes formed in the light-blocking layer and the lenses. The variations in shapes of the pinholes and the lenses vary the state of light transmitted through the lenses and focused on the sensors. This phenomenon may cause deterioration in detection accuracy.

SUMMARY

According to an aspect, a detection device includes: a substrate having a detection region; a plurality of photodiodes provided in the detection region; a first light-transmitting resin layer provided so as to cover the photodiodes; a light-blocking layer provided on the upper side of the first light-transmitting resin layer and provided with openings in regions overlapping the respective photodiodes; a second light-transmitting resin layer provided so as to cover the light-blocking layer; and a plurality of lenses provided on the upper side of the second light-transmitting resin layer so as to overlap the respective photodiodes. The second light-transmitting resin layer is provided so as to cover an end on a peripheral side of the light-blocking layer on a peripheral side of the substrate.

According to an aspect, an optical filter is provided in a detection device including a substrate having a detection region and a plurality of photodiodes provided in the detection region. The optical filter includes: a first light-transmitting resin layer; a light-blocking layer provided on the upper side of the first light-transmitting resin layer and provided with a plurality of openings; a second light-transmitting resin layer provided so as to cover the light-blocking layer; and a plurality of lenses provided on the upper side of the second light-transmitting resin layer. The second light-transmitting resin layer is provided so as to cover an end on a peripheral side of the light-blocking layer on a peripheral side of the first light-transmitting resin layer.

BRIEF DESCRIPTION OF THE DRAWINGS

FIG. 20 is a sectional view along XX-XX' of FIG. 19.

DETAILED DESCRIPTION

Figure 1A:
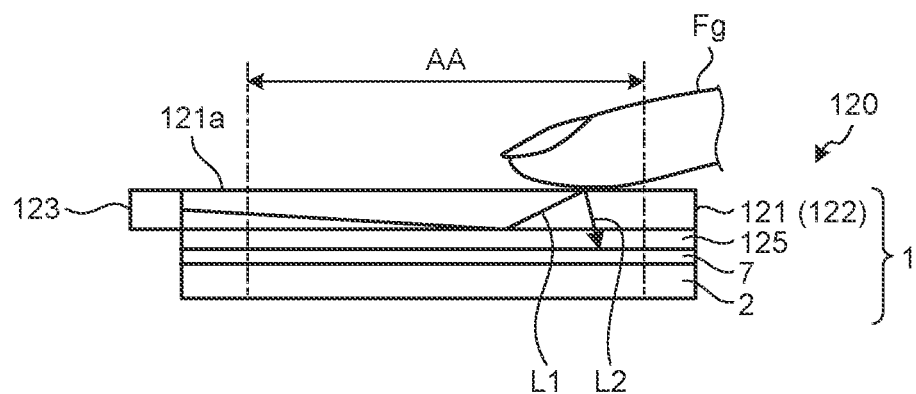
FIG. 1A is a sectional view illustrating a schematic sectional configuration of a detection apparatus having an illumination device, the detection apparatus including a detection device according to an embodiment.

The following describes a mode (embodiment) for carrying out the present disclosure in detail with reference to the drawings. The present disclosure is not limited to the description of the embodiment given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

Figure 1B:
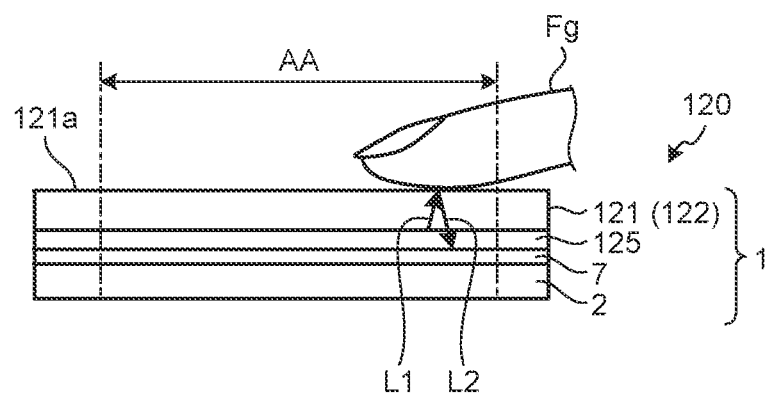
FIG. 1B is a sectional view illustrating a schematic sectional configuration of the detection apparatus having an illumination device, the detection apparatus including the detection device according to a first modification.
Figure 1C:
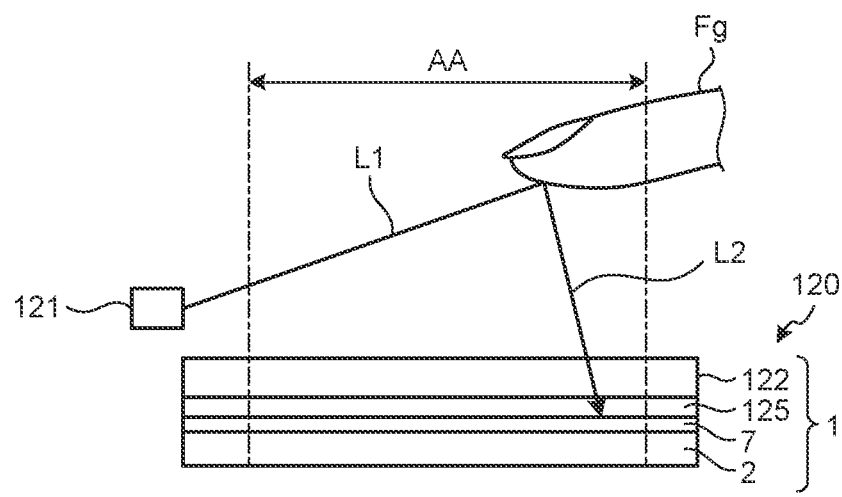
FIG. 1C is a sectional view illustrating a schematic sectional configuration of the detection apparatus having an illumination device, the detection apparatus including the detection device according to a second modification.
Figure 1D:
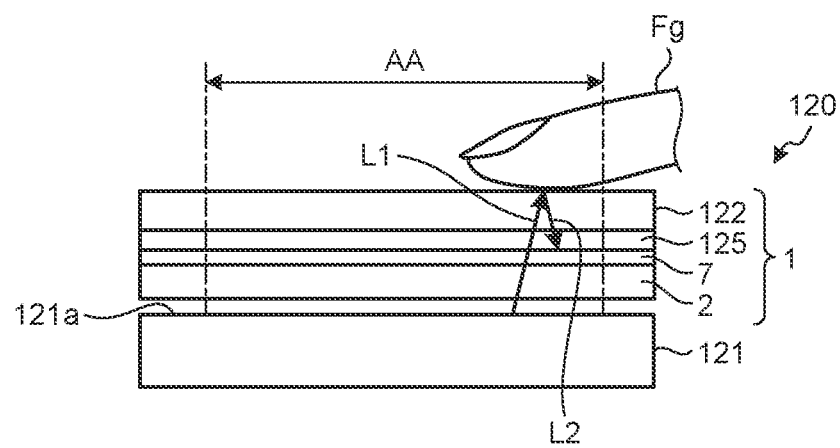
FIG. 1D is a sectional view illustrating a schematic sectional configuration of the detection apparatus having an illumination device, the detection apparatus including the detection device according to a third modification.

FIG. 1A is a sectional view illustrating a schematic sectional configuration of a detection apparatus having an illumination device, the detection apparatus including a detection device according to an embodiment. FIG. 1B is a sectional view illustrating a schematic sectional configuration of the detection apparatus having an illumination device, the detection apparatus including the detection device according to a first modification. FIG. 1C is a sectional view illustrating a schematic sectional configuration of the detection apparatus having an illumination device, the detection apparatus including the detection device according to a second modification. FIG. 1D is a sectional view illustrating a schematic sectional configuration of the detection apparatus having an illumination device, the detection apparatus including the detection device according to a third modification.

As illustrated in FIG. 1A, a detection apparatus 120 having an illumination device includes a detection device 1 and an illumination device 121. The detection device 1 includes an array substrate 2, an optical filter 7, an adhesive layer 125, and a cover member 122. That is, the array substrate 2, the optical filter 7, the adhesive layer 125, and the cover member 122 are stacked in this order in a direction orthogonal to a surface of the array substrate 2. As will be described later, the cover member 122 of the detection device 1 may be replaced with the illumination device 121. The adhesive layer 125 only needs to bond the optical filter 7 to the cover member 122, and the detection device 1 may have a structure without the adhesive layer 125 in a region corresponding to a detection region AA.

When the adhesive layer 125 is absent in the detection region AA, the detection device 1 has a structure in which the adhesive layer 125 bonds the cover member 122 to the optical filter 7 in a region corresponding to a peripheral region GA outside the detection region AA. The adhesive layer 125 provided in the detection region AA may be simply paraphrased as a protective layer for the optical filter 7. As illustrated in FIG. 1A, the illumination device 121 may be, for example, what is called a side light-type front light that uses the cover member 122 as a light guide plate provided in a position corresponding to the detection region AA of the detection device 1 and includes a plurality of light sources 123 arranged at one end or both ends of the cover member 122. That is, the cover member 122 has a light-emitting surface 121a for emitting light, and serves as one component of the illumination device 121. The illumination device 121 emits light L1 from the light-emitting surface 121a of the cover member 122 toward a finger Fg that serves as a detection target. For example, light-emitting diodes (LEDs), which emit light in a predetermined color, are used as the light sources.

As illustrated in FIG. 1B, the illumination device 121 may include the light sources (for example, LEDs) provided in the detection region AA of the detection device 1. The illumination device 121 including the light sources also serves as the cover member 122.

The illumination device 121 is not limited to the example of FIG. 1B. As illustrated in FIG. 1C, the illumination device 121 may be provided on a lateral side or an upper side of the cover member 122, and may emit the light L1 to the finger Fg from the lateral side or the upper side of the finger Fg.

Furthermore, as illustrated in FIG. 1D, the illumination device 121 may be what is called a direct-type backlight that includes the light sources (for example, LEDs) provided in the detection region AA of the detection device 1.

The light L1 emitted from the illumination device 121 is reflected as light L2 by the finger Fg serving as the detection target. The detection device 1 detects the light L2 reflected by the finger Fg to detect asperities (such as a fingerprint) on a surface of the finger Fg. The detection device 1 may further detect information on a living body by detecting the light L2 reflected in the finger Fg, in addition to detecting the fingerprint. Examples of the information on the living body include a vascular image, pulsation, and pulse waves of, for example, veins. The color of the light L1 from the illumination device 121 may be changed depending on the detection target.

The cover member 122 is a member for protecting the array substrate 2 and the optical filter 7 and covers the array substrate 2 and the optical filter 7. The illumination device 121 may have a structure to double as the cover member 122, as described above. In the structures illustrated in FIGS. 1C and 1D in which the cover member 122 is separate from the illumination device 121, the cover member 122 is a glass substrate, for example. The cover member 122 is not limited to the glass substrate, but may be a resin substrate, for example. The cover member 122 need not be provided. In that case, the surface of the array substrate 2 and the optical filter 7 is provided with a protective layer of, for example, an insulating film, and the finger Fg contacts the protective layer of the detection device 1.

As illustrated in FIG. 1B, the detection apparatus 120 having an illumination device may be provided with a display panel instead of the illumination device 121. The display panel may be, for example, an organic electroluminescent (EL) (organic light-emitting diode (OLED)) display panel or an inorganic EL (micro-LED or mini-LED) display. Alternatively, the display panel may be a liquid crystal display (LCD) panel using liquid crystal elements as display elements or an electrophoretic display (EPD) panel using electrophoretic elements as the display elements. Also in this case, the fingerprint of the finger Fg and the information on the living body can be detected based on the light L2 obtained by reflecting display light (light L1), which has been emitted from the display panel, by the finger Fg.

Figure 2:
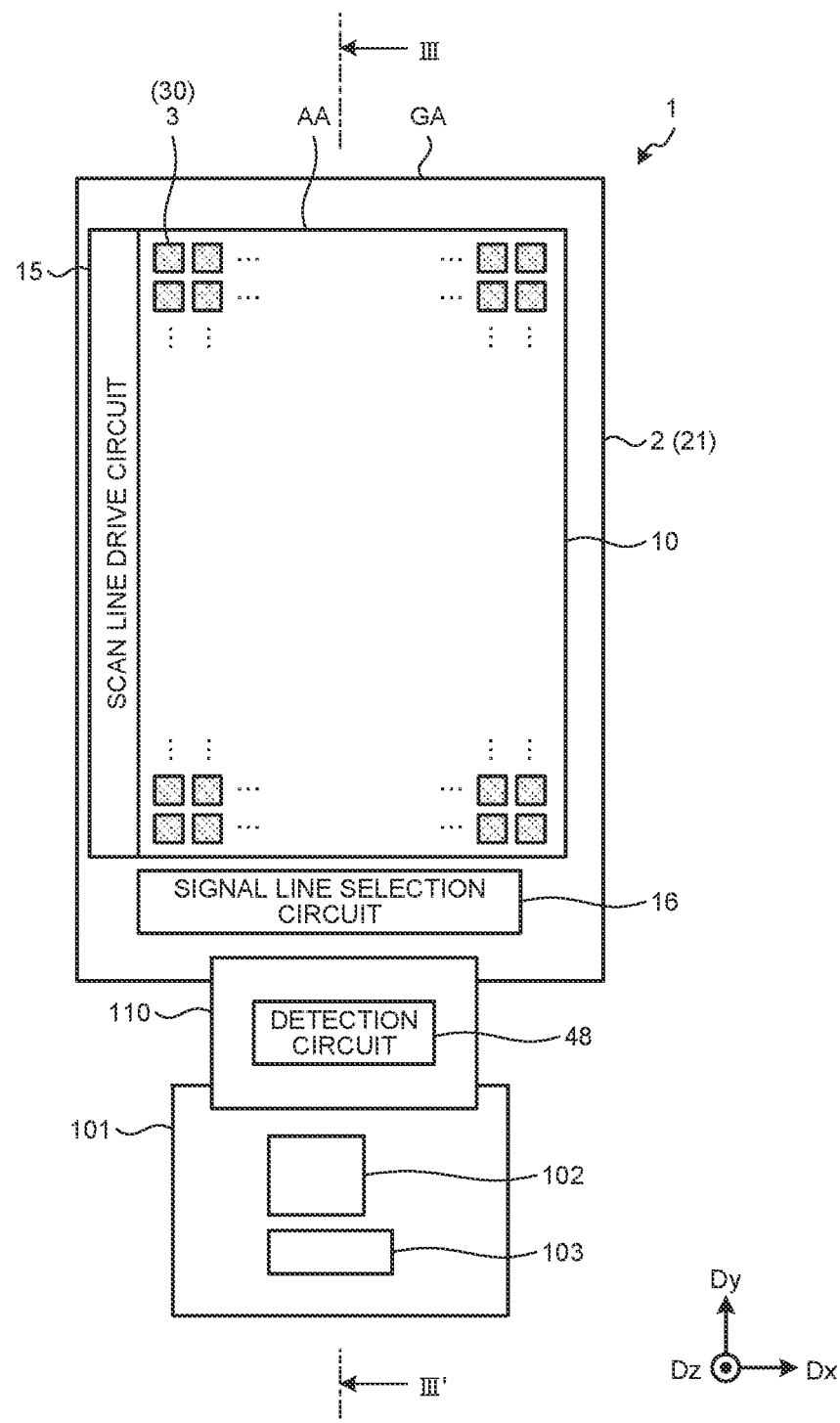
FIG. 2 is a plan view illustrating the detection device according to the embodiment.

FIG. 2 is a plan view illustrating the detection device according to the embodiment. A first direction Dx illustrated in FIG. 2 and the subsequent drawings is one direction in a plane parallel to a substrate 21. A second direction Dy is one direction in the plane parallel to the substrate 21 and is a direction orthogonal to the first direction Dx. The second direction Dy may non-orthogonally intersect the first direction Dx. A third direction Dz is a direction orthogonal to the first direction Dx and the second direction Dy and is a direction normal to the substrate 21. The term "plan view" refers to a positional relation as viewed in the third direction Dz.

As illustrated in FIG. 2, the detection device 1 includes the array substrate 2 (substrate 21), a sensor 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor 10, the scan line drive circuit 15, and the signal line selection circuit 16 to control an operation of the sensor 10. The power supply circuit 103 supplies voltage signals including, for example, a power supply potential VDD and a reference potential VCOM to the sensor 10, the scan line drive circuit 15, and the signal line selection circuit 16. In the present embodiment, the case is exemplified where the detection circuit 48 is disposed on the wiring substrate 110, but the present disclosure is not limited to this case. The detection circuit 48 may be disposed on the substrate 21.

The substrate 21 has the detection region AA and the peripheral region GA. The detection region AA and the peripheral region GA extend in planar directions parallel to the substrate 21. Elements (detection elements 3) of the sensor 10 are provided in the detection region AA. The peripheral region GA is a region outside the detection region AA and is a region not provided with the elements (detection elements 3) that serve as optical sensors. That is, the peripheral region GA is a region between the outer periphery of the detection region AA and the edges of the substrate 21. The scan line drive circuit 15 and the signal line selection circuit 16 are provided in the peripheral region GA. The scan line drive circuit 15 is provided in a region extending along the second direction Dy in the peripheral region GA. The signal line selection circuit 16 is provided in a region extending along the first direction Dx in the peripheral region GA, and is provided between the sensor 10 and the detection circuit 48.

Each of the detection elements 3 of the sensor 10 is an optical sensor including a photodiode 30 as a sensor element. The photodiode 30 is a photoelectric conversion element, and outputs an electrical signal corresponding to light irradiating each of the photodiodes 30. More specifically, the photodiode 30 is a positive-intrinsic-negative (PIN) photodiode. The photodiode 30 may be an organic photodiode (OPD). The detection elements 3 are arranged in a matrix having a row-column configuration in the detection region AA. The photodiode 30 included in each of the detection elements 3 performs the detection in accordance with gate drive signals supplied from the scan line drive circuit 15. Each of the photodiodes 30 outputs the electrical signal corresponding to the light irradiating the photodiode 30 as a detection signal to the signal line selection circuit 16.

The detection device 1 detects the information on the living body based on the detection signals received from the photodiodes 30.

Figure 3:
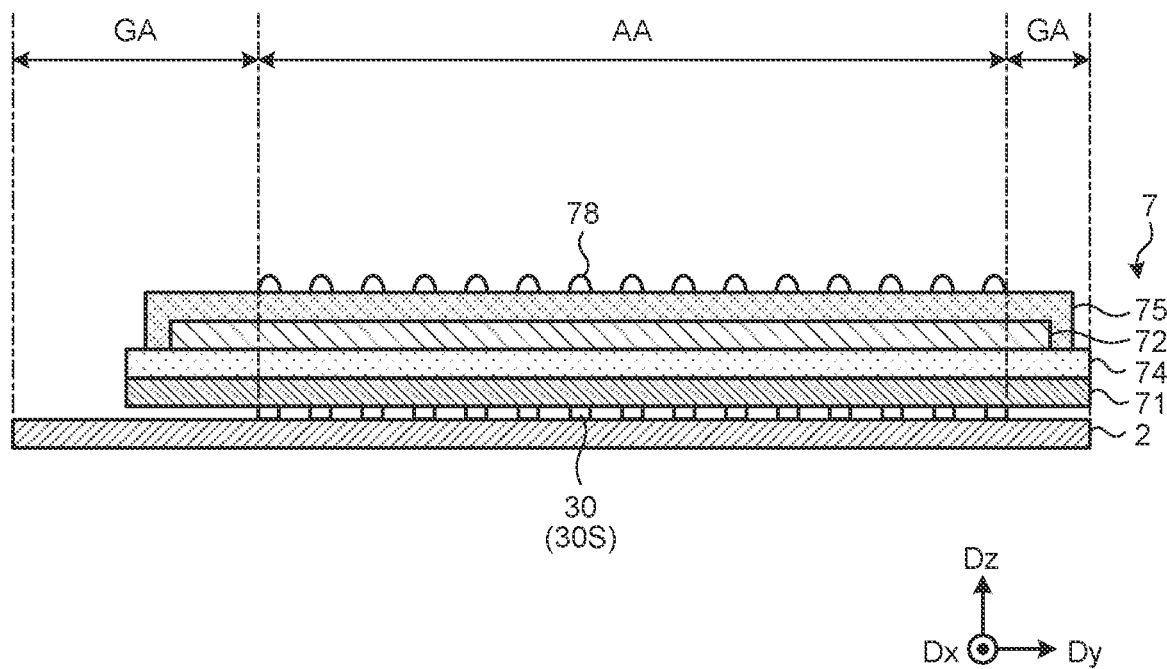
FIG. 3 is a sectional view along III-III' of FIG. 2.

FIG. 3 is a sectional view along III-III' of FIG. 2. FIG. 3 schematically illustrates a multilayered configuration of the array substrate 2, the photodiodes 30, and the optical filter 7.

As illustrated in FIG. 3, the optical filter 7 is provided on the photodiodes 30 (partial photodiodes 30S). The optical filter 7 includes a first light-blocking layer 71, a second light-blocking layer 72, a first light-transmitting resin layer 74, a second light-transmitting resin layer 75, and lenses 78. The optical filter 7 illustrated in FIG. 3 is merely schematically illustrated, and a detailed multilayered configuration of the optical filter 7 will be described later. The optical filter 7 is an optical element that receives the light L2 reflected by an object to be detected (e.g, the finger Fg), transmits, toward the photodiodes 30, components of the light L2 that travel in the third direction Dz, and blocks components of the light L2 that travel in oblique directions. The optical filter 7 is also called collimating apertures or a collimator.

The optical filter 7 is provided over the detection region AA and the peripheral region GA. The optical filter 7 includes, on an upper surface thereof, the lenses 78. The lenses 78 are provided in the detection region AA and are provided so as to overlap the respective photodiodes 30 (partial photodiodes 30S). The light L2 reflected by the object to be detected such as the finger Fg is condensed by the lenses 78, and irradiates the photodiodes 30 (partial photodiodes 30S) corresponding to the lenses 78.

While the lenses 78 are not provided in the peripheral region GA, dummy lenses that do not serve as optical elements may be provided in the peripheral region GA. The dummy lenses are provided so as not to overlap the photodiodes 30 (partial photodiodes 30S) in the detection region AA. The dummy lenses are formed to have the same configuration as that of the lenses 78. Providing the dummy lenses can improve the shape stability of the lenses 78 in the detection region AA.

Figure 4:
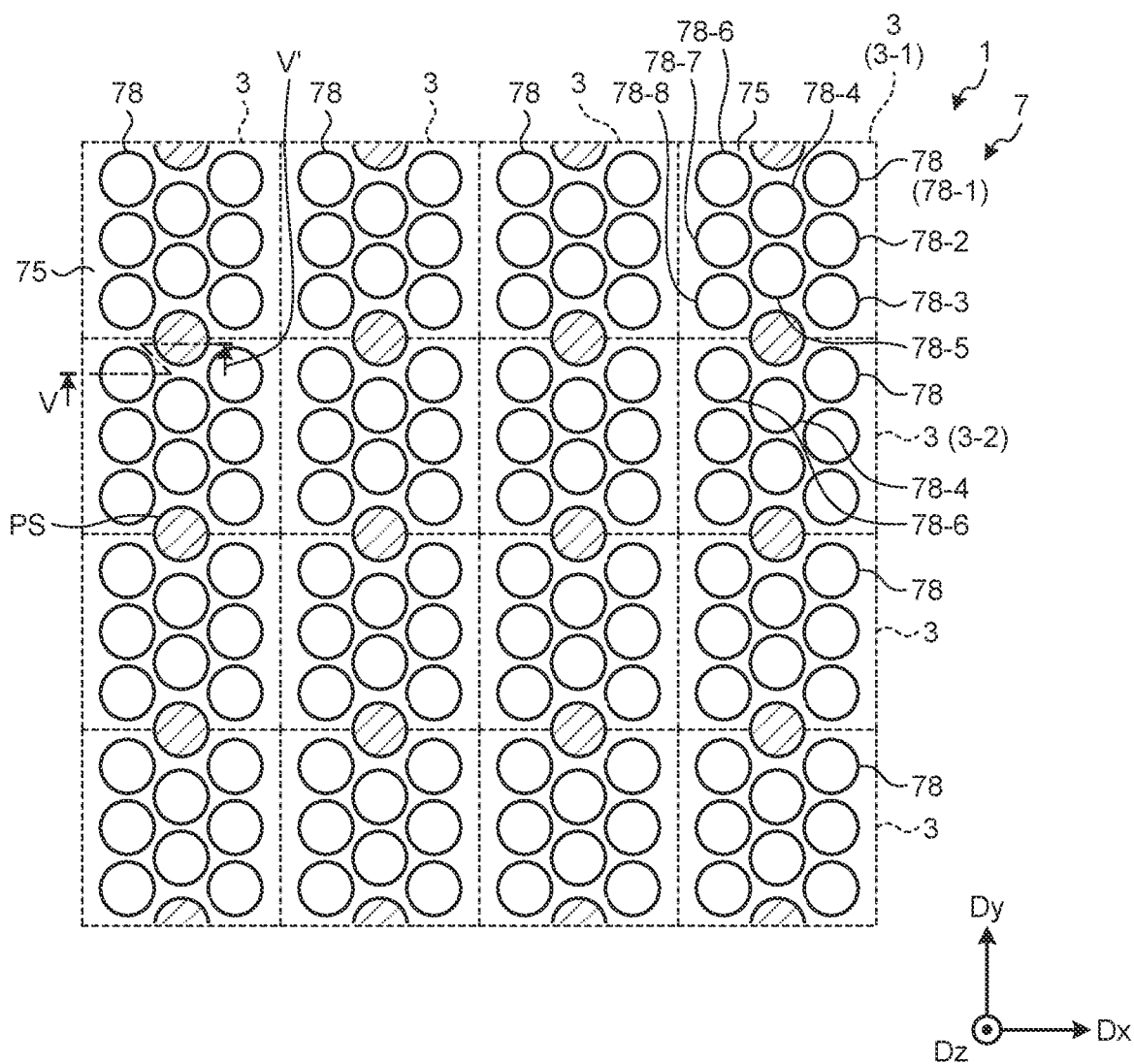
FIG. 4 is a plan view illustrating an optical filter according to the embodiment.

The following describes a detailed configuration of the detection elements 3 and the optical filter 7. FIG. 4 is a plan view illustrating the optical filter according to the embodiment.

As illustrated in FIG. 4, the optical filter 7 is provided so as to cover the detection elements 3 (photodiodes 30) arranged in a matrix having a row-column configuration. The optical filter 7 includes the first light-transmitting resin layer 74 and the second light-transmitting resin layer 75 that cover the detection elements 3, and includes the lenses 78 provided for each of the detection elements 3. The optical filter 7 further includes a plurality of projections PS provided between the adjacent lenses 78.

More than one of the lenses 78 are arranged for each of the detection elements 3. In the example illustrated in FIG. 4, eight lenses 78 (78-1, 78-2, . . . , 78-8) are provided for each of the detection elements 3. The lenses 78-1, 78-2, . . . , 78-8 are arranged in a triangular lattice pattern. As will be described later, each of the detection elements 3 has a plurality of detection regions (partial photodiodes 30S), thus having a structure in which the lenses 78 correspond to the detection regions in each of the detection elements 3.

The number of the lenses 78 arranged in each of the detection elements 3 may be seven or smaller, or nine or larger so as to match the number of the detection regions.

The arrangement of the lenses 78 may also be changed as appropriate depending on the configuration of the photodiodes 30.

The projection PS is a columnar member formed in the same circular shape as that of each of the lenses 78 in plan view. The projection PS is used as a spacer when the cover member 122 and the like are stacked on the optical filter 7. Alternatively, the projection PS is used as a spacer when the array substrate 2 and another substrate are layered in the manufacturing process of the detection device 1. Each of the projections PS is provided so as to be surrounded by six of the lenses 78. More specifically, the projection PS is disposed between the lens 78-4 and the lens 78-5 in the second direction Dy. The projection PS is disposed between the lenses 78-1 and 78-3 and the lenses 78-6 and 78-8 in the first direction Dx. The projections PS are arranged in a triangular lattice pattern with the lenses 78, and are efficiently arranged in spaces between the lenses 78.

The projection PS is provided at a boundary between the detection elements 3 adjacent in the second direction Dy (for example, at a boundary between the detection elements 3-1 and 3-2). In other words, the projection PS is provided between the photodiodes 30 adjacent in the second direction Dy in plan view. The number of projections PS is smaller than the number of the lenses 78. The projections PS are provided so as not to overlap the partial photodiodes 30S of the photodiodes 30.

However, the arrangement and the number of projections PS can be changed as appropriate. For example, the projection PS may be provided at a boundary between the detection elements 3 adjacent in the first direction Dx. Although each of the detection elements 3 is provided with the projection PS, one or more of the detection elements 3 may not be provided with the projection PS. The projection PS may have a different shape and size from those of the lens 78.

Figure 5:
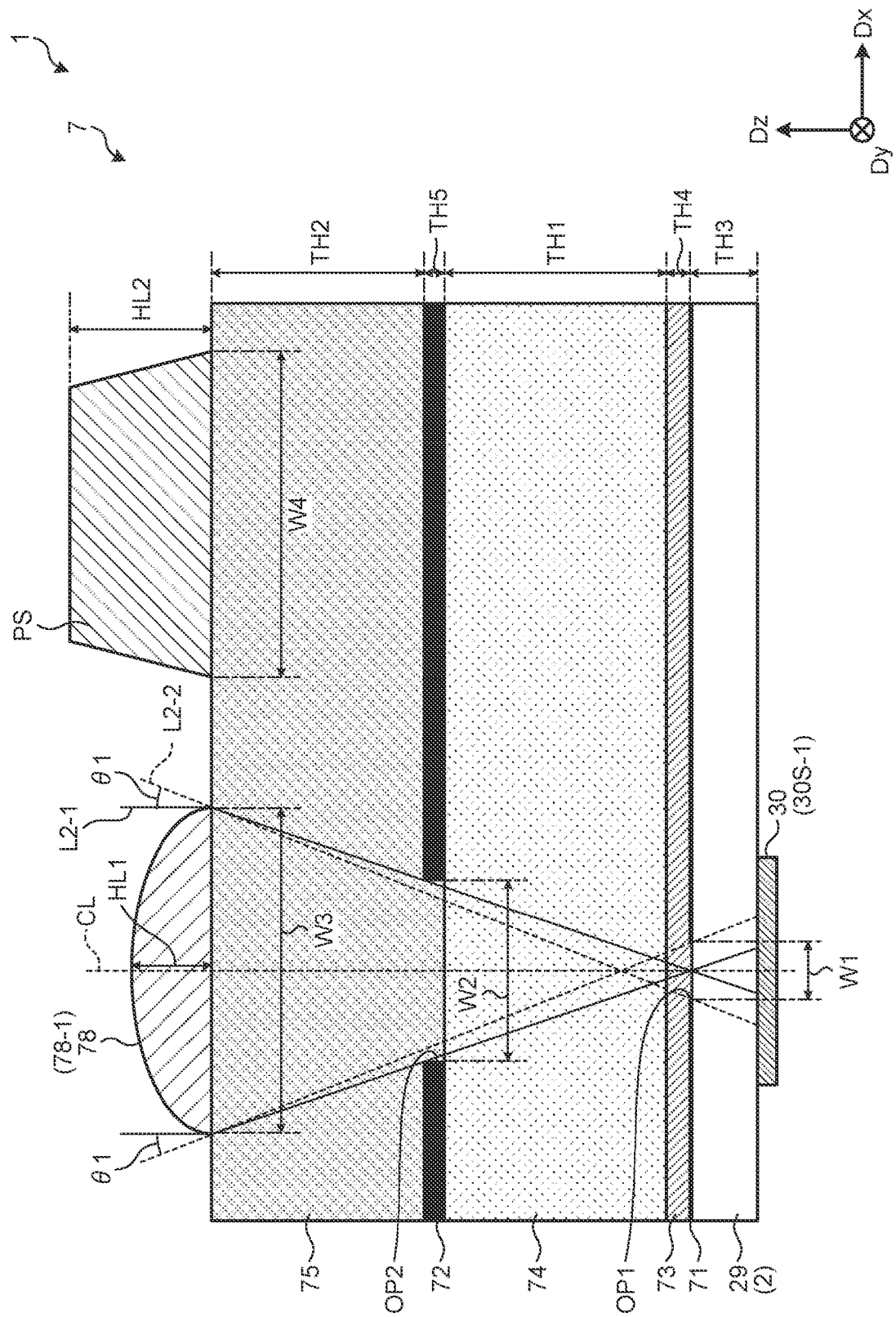
FIG. 5 is a sectional view illustrating the optical filter.

FIG. 5 is a sectional view illustrating the optical filter. FIG. 5 is a sectional view along V-V' of FIG. 4. FIG. 5 illustrates the configuration of the array substrate 2 in a simplified manner and schematically illustrates the photodiode 30 (partial photodiode 30S-1) and a protective film 29 (organic protective film) covering the photodiode 30.

As illustrated in FIG. 5, the optical filter 7 includes the first light-blocking layer 71, the second light-blocking layer 72, a filter layer 73 (infrared (IR) cut filter layer), the first light-transmitting resin layer 74, the second light-transmitting resin layer 75, and the lens 78. In the present embodiment, the first light-blocking layer 71, the filter layer 73, the first light-transmitting resin layer 74, the second light-blocking layer 72, the second light-transmitting resin layer 75, and the lens 78 are stacked in this order on the protective film 29. The projection PS is formed integrally with the optical filter 7, and is provided in the same layer as that of the lens 78 on the second light-transmitting resin layer 75.

The lens 78 is provided in a region overlapping the partial photodiode 30S-1 of one photodiode 30. The lens 78 is a convex lens. An optical axis CL of the lens 78 is provided in a direction parallel to the third direction Dz, and intersects the partial photodiode 30S-1. The lens 78 is provided on the second light-transmitting resin layer 75 so as to be in direct contact therewith. In other words, the second light-transmitting resin layer 75 is provided between the second light-blocking layer 72 and the lens 78. In the present embodiment, no light-blocking layer or the like is provided on the second light-transmitting resin layer 75 between the adjacent lenses 78.

The first light-blocking layer 71 is provided on the protective film 29 of the array substrate 2 so as to be in direct contact therewith. In other words, the first light-blocking layer 71 is provided between the photodiode 30 and the lens 78 in the third direction Dz. The first light-blocking layer 71 is provided with a first opening OP1 in a region overlapping the photodiode 30. The first opening OP1 is formed in a region overlapping the optical axis CL.

The first light-blocking layer 71 is formed of, for example, a metal material such as molybdenum (Mo). This configuration allows the first light-blocking layer 71 to reflect components of the light L2 traveling in the oblique directions other than the light L2 that passes through the first opening OP1. Since the first light-blocking layer 71 is formed of a metal material, a width W1 in the first direction Dx (diameter) of the first opening OP1 can be accurately formed. Therefore, the first opening OP1 can be provided correspondingly to the photodiode 30 even when the arrangement pitch and the area of the photodiodes 30 are small.

In addition, unlike the second light-blocking layer 72 formed of a resin material to be described later, the first light-blocking layer 71 is formed of a metal material. Therefore, the first light-blocking layer 71 can be formed to be thinner than the second light-blocking layer 72 and can have the first opening OP1 formed therein that is smaller than a second opening OP2 formed in the second light-blocking layer 72. The thickness of the first light-blocking layer 71 is equal to or smaller than one tenth the thickness of the second light-blocking layer 72. The first light-blocking layer 71 is formed to have a much smaller thickness than that of the second light-blocking layer 72. As an example, the thickness of the first light-blocking layer 71 is equal to or larger than 0.055 µm, and is, for example, 0.065 µm; and a thickness TH5 of the second light-blocking layer 72 (refer to FIG. 5) is, for example, 1 µm. The first light-blocking layer 71 is formed to have a much smaller thickness than the thickness TH5 of the second light-blocking layer 72.

The filter layer 73 is provided on the first light-blocking layer 71 so as to be in direct contact therewith and is provided between the first light-blocking layer 71 and the first light-transmitting resin layer 74 in the third direction Dz. The filter layer 73 is a filter that blocks light in a predetermined wavelength band. The filter layer 73 is, for example, an IR cut filter formed of a resin material colored in green and blocks infrared rays. Thus, the optical filter 7 can improve the detection sensitivity by allowing, for example, a component of the light L2 in a wavelength band required for the fingerprint detection to enter the photodiode 30.

The first light-transmitting resin layer 74 is provided on the filter layer 73 so as to be in direct contact therewith, and is provided between the first light-blocking layer 71 and the second light-blocking layer 72 in the third direction Dz. The first light-transmitting resin layer 74 and the second light-transmitting resin layer 75 are formed of a light-transmitting acrylic resin, for example.

The second light-blocking layer 72 is provided on the first light-transmitting resin layer 74 so as to be in direct contact therewith. The second light-blocking layer 72 is provided with the second opening OP2 in a region overlapping the photodiode 30 and the first opening OP1. The second opening OP2 is formed in a region overlapping the optical axis CL. More preferably, the center of the second opening OP2 and the center of the first opening OP1 are provided so as to overlap the optical axis CL.

The second light-blocking layer 72 is formed of, for example, a resin material colored in black. With the above-described configuration, the second light-blocking layer 72 serves as a light-absorbing layer that absorbs the components of the light L2 traveling in the oblique directions other than the light L2 passing through the second opening OP2. The second light-blocking layer 72 also absorbs light reflected by the first light-blocking layer 71. With this configuration, as compared with a configuration in which the second light-blocking layer 72 is formed of a metal material, the light reflected by the first light-blocking layer 71 can be restrained from being repeatedly reflected a plurality of number of times, traveling as stray light through the first light-transmitting resin layer 74, and entering the other photodiodes 30. The second light-blocking layer 72 can also absorb outside light incident from between the adjacent lenses 78. Thus, as compared with the configuration in which the second light-blocking layer 72 is formed of a metal material, the reflected light can be reduced in the second light-blocking layer 72. However, the second light-blocking layer 72 is not limited to the example of being formed of a resin material colored in black and may be formed of a metal material having blackened surfaces.

The second light-transmitting resin layer 75 is provided on the second light-blocking layer 72 so as to be in direct contact therewith and is provided between the second light-blocking layer 72 and the lens 78 in the third direction Dz.

The same material as that of the first light-transmitting resin layer 74 is used for the second light-transmitting resin layer 75, and thus, the refractive index of the second light-transmitting resin layer 75 is substantially equal to the refractive index of the first light-transmitting resin layer 74. As a result, the light L2 can be restrained from being reflected on an interface between the first light-transmitting resin layer 74 and the second light-transmitting resin layer 75 in the second opening OP2. However, the first light-transmitting resin layer 74 and the second light-transmitting resin layer 75 are not limited to this configuration and may be formed of different materials, and the refractive index of the first light-transmitting resin layer 74 may differ from that of the second light-transmitting resin layer 75.

In the present embodiment, the width decreases in the order of a width W3 in the first direction Dx (diameter) of the lens 78, a width W2 in the first direction Dx (diameter) of the second opening OP2, and the width W1 in the first direction Dx (diameter) of the first opening OP1. The width W1 in the first direction Dx of the first opening OP1 is smaller than the width in the first direction Dx of the partial photodiode 30S-1 of the photodiode 30. The width W1 is in a range from 2 μm to 10 μm, for example, approximately 3.5 μm. The width W2 is in a range from 3 μm to 20 μm, for example, approximately 10.0 μm. The width W3 is in a range from 10 μm to 50 μm, for example, approximately 21.9 μm.

A thickness TH2 of the second light-transmitting resin layer 75 illustrated in FIG. 5 is made substantially the same as a thickness TH1 of the first light-transmitting resin layer 74 or smaller than the thickness TH1 of the first light-transmitting resin layer 74. The thickness TH1 of the first light-transmitting resin layer 74 and the thickness TH2 of the second light-transmitting resin layer 75 are made larger than a thickness TH4 of the filter layer 73. The thickness TH1 of the first light-transmitting resin layer 74 and the thickness TH2 of the second light-transmitting resin layer 75 are larger than a thickness TH3 of the protective film 29 of the array substrate 2. The thickness TH1 and the thickness TH2 are in a range from 3 μm to 30 μm. For example, the thickness TH1 is approximately 18 μm. The thickness TH2 is approximately 16.5 μm, for example. The thickness TH3 is in a range from 1 μm to 10 μm, for example, equal to or larger than 4.5 μm. The thickness TH4 of the filter layer 73, as an example, is in a range from 1 μm to 5 μm, for example, 1.35 μm.

With the above-described configuration, light L2-1 traveling in the third direction Dz among rays of the light L2 reflected by the object to be detected such as the finger Fg is condensed by the lens 78, and passes through the second opening OP2 and the first opening OP1 to enter the photodiode 30. Light L2-2 tilted by an angle 81 from the third direction Dz also passes through the second opening OP2 and the first opening OP1 to enter the photodiode 30.

The projection PS is provided in a position that overlaps a portion of the first light-blocking layer 71 not provided with the first opening OP1 and a portion of the second light-blocking layer 72 not provided with the second opening OP2. The projection PS overlaps neither the first opening OP1 nor the second opening OP2, and the light L2 having passed through the projection PS is blocked by the first light-blocking layer 71 and the second light-blocking layer 72. Although the detection device 1 has the configuration provided with the projection PS, the detection device 1 can restrain the detection accuracy from decreasing.

A width W4 in the first direction Dx (diameter) of the projection PS is equal to the width W3 in the first direction Dx (diameter) of the lens 78. In the third direction Dz, a height HL2 of the projection PS is greater than a height HL1 of the lens 78. In the third direction Dz, the top of the projection PS is provided in a position higher than the top of the lens 78. The projection PS is formed of a resin material and is patterned into a columnar shape using a photolithography technique. In FIG. 5, the upper surface of the projection PS is formed to be flat. FIG. 5 is, however, merely schematically illustrated. The upper surface of the projection PS may have a curved surface in the same manner as the lens 78.

Figure 6:
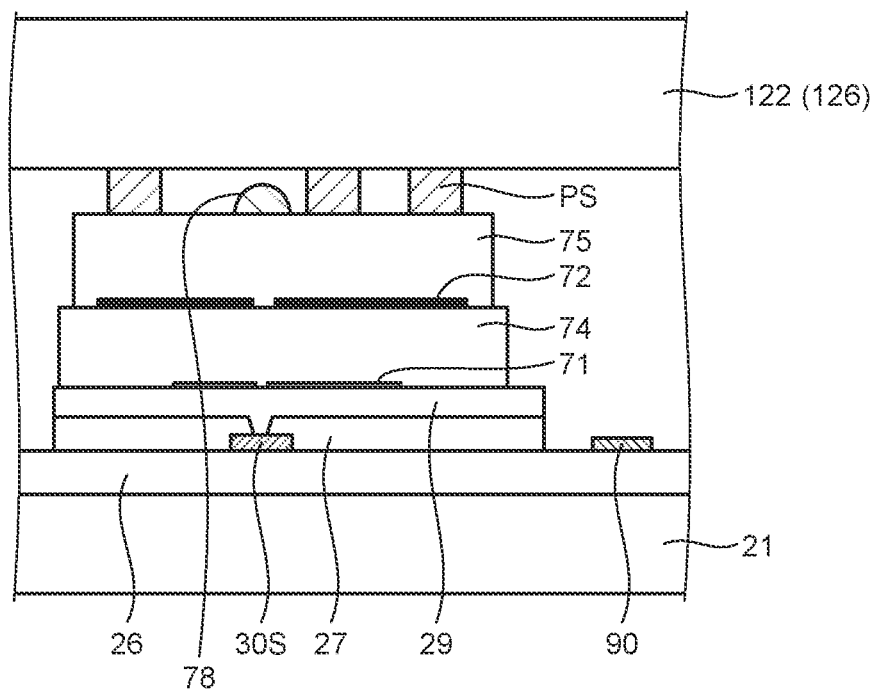
FIG. 6 is a sectional view schematically illustrating a configuration of an array substrate attached to a display panel.

FIG. 6 is a sectional view schematically illustrating a configuration of the array substrate attached to the display panel. As illustrated in FIG. 6, the substrate 21 and a display panel 126 are attached together such that the projection PS is in contact with a lower surface of the display panel 126. This configuration restrains the lens 78 in the detection device 1 from contacting the display panel 126, thereby restraining the lens 78 from being damaged.

The thicknesses of the layers of the optical filter 7, the width W1 of the first opening OP1, and the width W2 of the second opening OP2 illustrated in FIG. 5 can be changed as appropriate according to characteristics required for the optical filter 7. Other members such as the cover member 122 may be stacked instead of the display panel 126 illustrated in FIG. 6.

Figure 7:
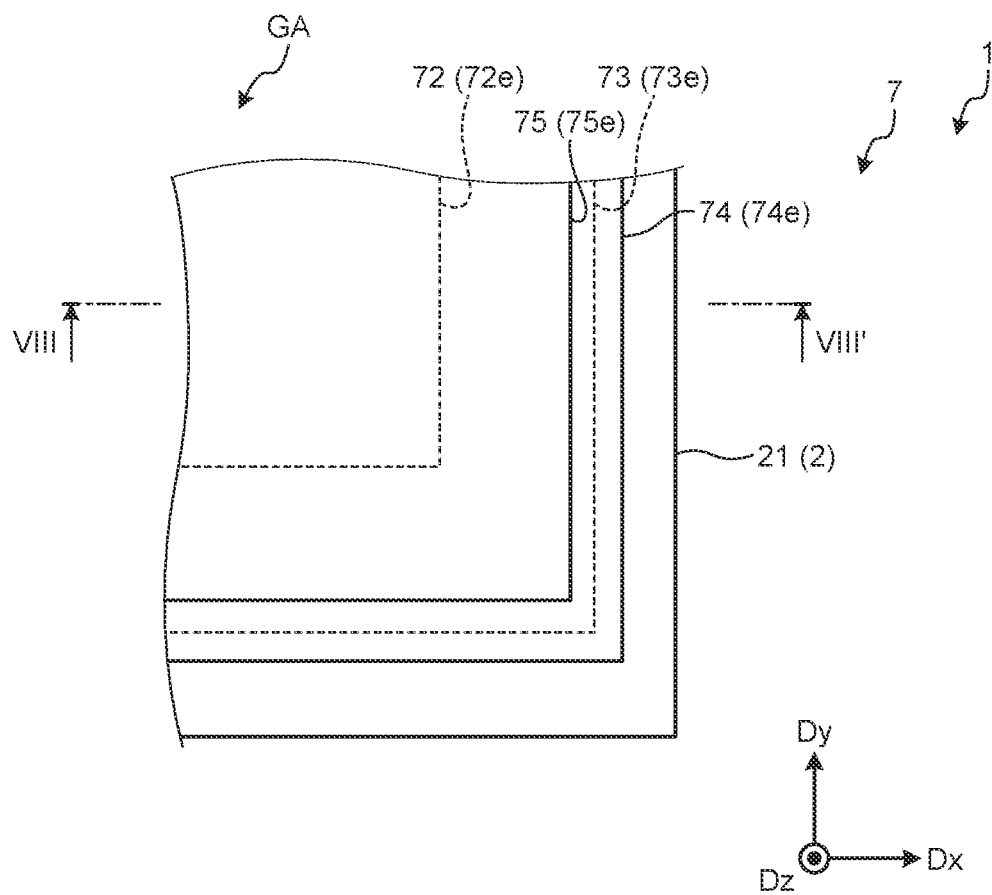
FIG. 7 is a plan view schematically illustrating the array substrate and the optical filter in a peripheral region.
Figure 8:
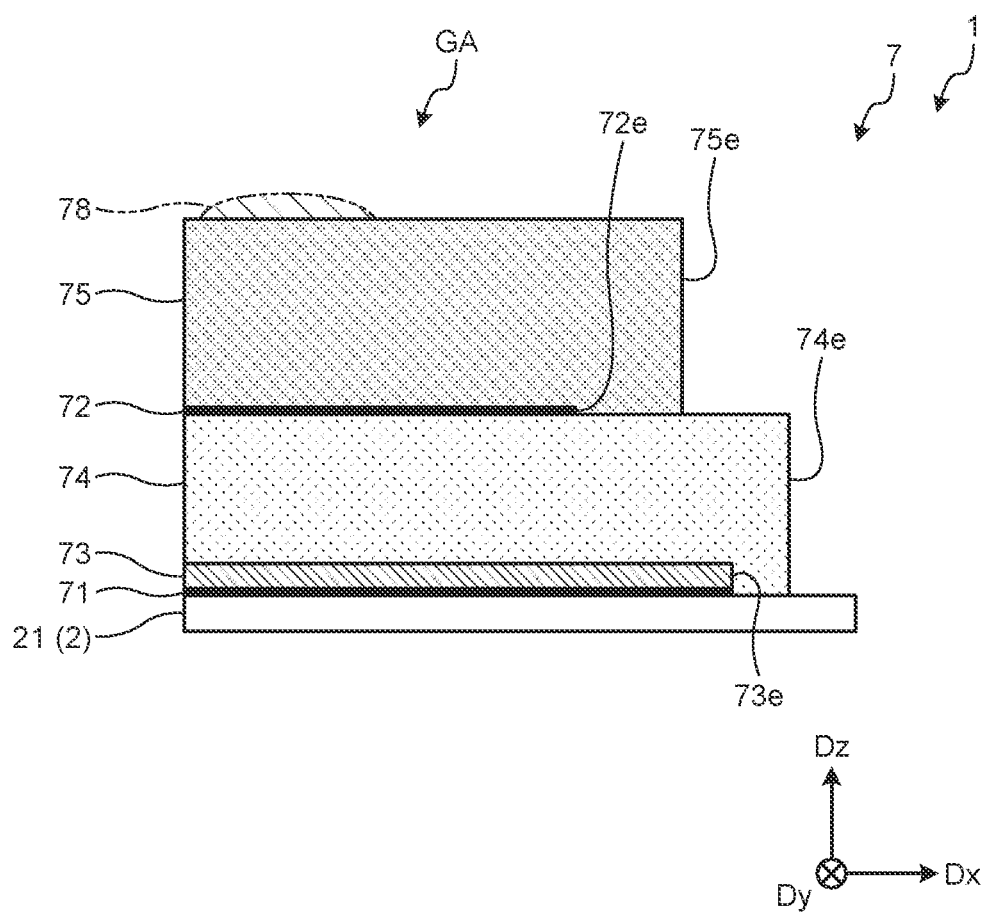
FIG. 8 is a sectional view illustrating the optical filter in the peripheral region.

The following describes a detailed configuration of the optical filter 7 on the peripheral side of the array substrate 2. FIG. 7 is a plan view schematically illustrating the array substrate and the optical filter in the peripheral region. FIG. 8 is a sectional view illustrating the optical filter in the peripheral region. As illustrated in FIGS. 7 and 8, the first light-blocking layer 71, the filter layer 73, the first light-transmitting resin layer 74, the second light-blocking layer 72, and the second light-transmitting resin layer 75 are stacked in this order on the peripheral side of the array substrate 2. On the peripheral side of the array substrate 2, the second light-transmitting resin layer 75 is provided so as to cover an end 72e on the peripheral side of the second light-blocking layer 72. Also on the peripheral side of the array substrate 2, the first light-transmitting resin layer 74 is provided so as to cover an end 73e on the peripheral side of the filter layer 73.

In the first direction Dx, an end 75e on the peripheral side of the second light-transmitting resin layer 75 is located closer to the detection region AA than an end 74e on the peripheral side of the first light-transmitting resin layer 74 (in a direction away from an end on the peripheral side of the array substrate 2). Also in the first direction Dx, the end 72e on the peripheral side of the second light-blocking layer 72 is located closer to the detection region AA than the end 73e on the peripheral side of the filter layer 73 (and an end on the peripheral side of the first light-blocking layer 71).

In the example illustrated in FIGS. 7 and 8, the end 74e on the peripheral side of the first light-transmitting resin layer 74, the end 73e on the peripheral side of the filter layer 73, the end 75e on the peripheral side of the second light-transmitting resin layer 75, and the end 72e on the peripheral side of the second light-blocking layer 72 are arranged in the first direction Dx from the periphery side of the array substrate 2 toward the detection region AA.

Thus, in the optical filter 7, the second light-blocking layer 72, the filter layer 73, the first light-transmitting resin layer 74, and the second light-transmitting resin layer 75 are stacked such that the positions of the ends 72e, 73e, 74e, and 75e are shifted from one another on the peripheral side of the array substrate 2. With this configuration, compared with a case where the layers are formed so as to match the positions of the ends 72e, 73e, 74e, and 75e on the peripheral side of the array substrate 2, steep steps are not formed and a smoother step shape is formed as a whole on the peripheral side of the array substrate 2.

That is, compared with the case where the layers are formed so as to match the positions of the ends 72e, 73e, 74e, and 75e on the peripheral side of the array substrate 2, shape variations decrease at the end 74e on the peripheral side of the first light-transmitting resin layer 74, and the end 75e on the peripheral side of the second light-transmitting resin layer 75. As a result, non-uniformity of shapes of the second light-blocking layer 72 (second opening OP2) and the lenses 78 that would be caused by the shape variations at the ends 74e and 75e can be reduced when the second light-blocking layer 72 and the lenses 78 are formed by coating. Therefore, the detection device 1 can reduce the variation of the light L2 focused on the photodiode 30 (partial photodiode 30S) through the lens 78 and the second opening OP2, and thus can restrain the detection accuracy from decreasing.

The optical filter 7 is formed integrally with the array substrate 2. That is, the first light-blocking layer 71 of the optical filter 7 is provided on the protective film 29 so as to be in direct contact therewith, and no member such as an adhesive layer is provided between the first light-blocking layer 71 and the protective film 29. Since the optical filter 7 is formed by directly forming the films on the array substrate 2 and applying a process such as patterning thereto, the positional accuracy of the first opening OP1, the second opening OP2, and the lens 78 of the optical filter 7 relative to the photodiode 30 can be improved, compared with a case where the optical filter 7 is bonded as a separate body to the array substrate 2. The optical filter 7 is, however, not limited to this configuration and may be what is called an external optical filter bonded to the protective film 29 of the array substrate 2 with an adhesive layer interposed therebetween.

The optical filter 7 is also not limited to the configuration including the first light-blocking layer 71 and the second light-blocking layer 72 and may be formed including only one light-blocking layer. Although the filter layer 73 is provided between the first light-blocking layer 71 and the first light-transmitting resin layer 74, the position of the filter layer 73 is not limited to this position. The position of the filter layer 73 can be changed as appropriate depending on the characteristics required for the optical filter 7 and the manufacturing process.

FIG. 8 merely schematically illustrates the shapes of the end 74e on the peripheral side of the first light-transmitting resin layer 74, the end 73e on the peripheral side of the filter layer 73, the end 75e on the peripheral side of the second light-transmitting resin layer 75, and the end 72e on the peripheral side of the second light-blocking layer 72. That is, each of the ends 72e, 73e, 74e, and 75e (side surfaces) is not limited to a configuration extending in the third direction Dz and may be formed at an angle.

Figure 9:
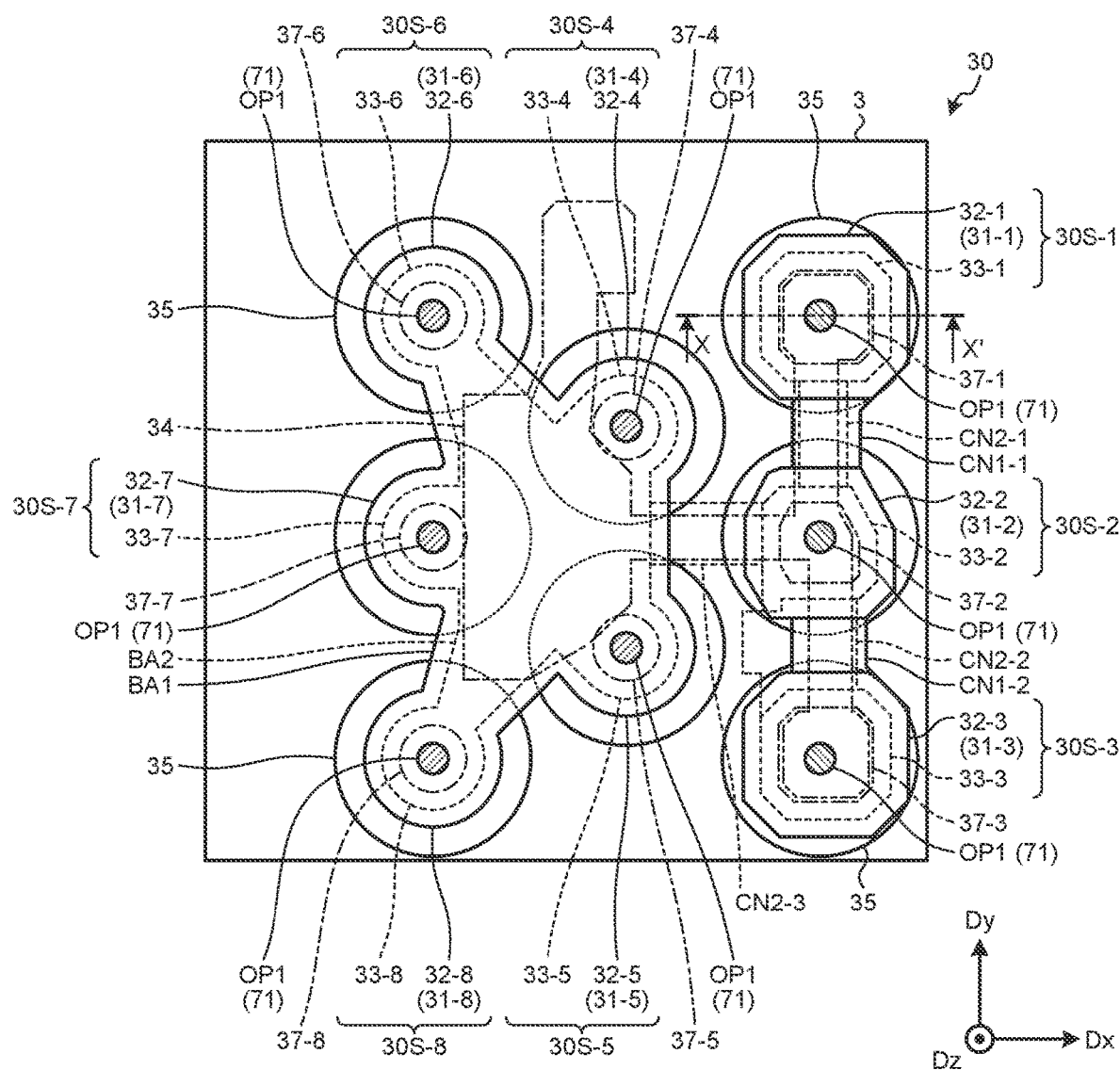
FIG. 9 is a plan view illustrating a detection element.

FIG. 9 is a plan view illustrating the detection element. For ease of viewing, FIG. 9 is illustrated without the transistors included in the detection element 3 and the various types of wiring including, for example, the scan lines and the signal lines. Each of the detection elements 3 is defined, for example, as a region surrounded by the scan lines and the signal lines.

As illustrated in FIG. 9, the photodiode 30 includes a plurality of partial photodiodes 30S-1, 30S-2, . . . , 30S-8. The partial photodiodes 30S-1, 30S-2, . . . , 30S-8 are arranged in a triangular lattice pattern. The lenses 78-1, 78-2, . . . , 78-8 illustrated in FIG. 4, the first openings OP1 of the first light-blocking layer 71, and the second openings OP2 of the second light-blocking layer 72 are provided so as to overlap the respective partial photodiodes 30S-1, 30S-2, . . . , 30S-8.

More specifically, the partial photodiodes 30S-1, 30S-2, and 30S-3 are arranged in the second direction Dy. The partial photodiodes 30S-4 and 30S-5 are arranged in the second direction Dy and are adjacent in the first direction Dx to an element column that includes the partial photodiodes 30S-1, 30S-2, and 30S-3. The partial photodiodes 30S-6, 30S-7, and 30S-8 are arranged in the second direction Dy and are adjacent in the first direction Dx to an element column that includes the partial photodiodes 30S-4 and 30S-5. The positions in the second direction Dy of the partial photodiodes 30S are arranged in a staggered manner between the adjacent element columns.

The light L2 is incident on the partial photodiodes 30S-1, 30S-2, . . . , 30S-8 from the lenses 78-1, 78-2, . . . , 78-8, respectively. The partial photodiodes 30S-1, 30S-2, . . . , 30S-8 are electrically coupled to one another and serve as one photodiode 30. That is, the signals output from the respective partial photodiodes 30S-1, 30S-2, . . . , 30S-8 are integrated, and one detection signal is output from the photodiode 30. In the following description, the partial photodiodes 30S-1, 30S-2, . . . , 30S-8 will be simply referred to as the partial photodiodes 30S when need not be distinguished from one another.

Each of the partial photodiodes 30S includes an i-type semiconductor layer 31, an n-type semiconductor layer 32, and a p-type semiconductor layer 33. The i-type semiconductor layer 31 and the n-type semiconductor layer 32 are formed of amorphous silicon (a-Si), for example. The p-type semiconductor layer 33 is formed of polysilicon (p-Si), for example. The material of each of the semiconductor layers is not limited to those mentioned above and may be, for example, polysilicon or microcrystalline silicon.

The a-Si of the n-type semiconductor layer 32 is doped with impurities to form an n+ region. The p-Si of the p-type semiconductor layer 33 is doped with impurities to form a p+ region. The i-type semiconductor layer 31 is, for example, a non-doped intrinsic semiconductor and has lower electric conductivity than that of the n-type semiconductor layer 32 and the p-type semiconductor layer 33.

FIG. 9 uses a long dashed short dashed line to illustrate an effective sensing region 37 in which the p-type semiconductor layer 33 is coupled to the i-type semiconductor layer 31 (n-type semiconductor layer 32). The first opening OP1 of the first light-blocking layer 71 is provided so as to overlap the sensing region 37.

The partial photodiodes 30S have different shapes from one another in plan view. The partial photodiodes 30S-1, 30S-2, and 30S-3 are each formed in a polygonal shape. The partial photodiodes 30S-4, 30S-5, 30S-6, 30S-7, and 30S-8 are each formed in a circular shape or a semi-circular shape.

The n-type semiconductor layers 32 of the partial photodiodes 30S-1, 30S-2, and 30S-3 arranged in the second direction Dy are electrically coupled together by coupling portions CN1-1 and CN1-2. The p-type semiconductor layers 33 of the partial photodiodes 30S-1, 30S-2, and 30S-3 are electrically coupled together by coupling portions CN2-1 and CN2-2.

The n-type semiconductor layers 32 (i-type semiconductor layers 31) of the partial photodiodes 30S-4, 30S-5, 30S-6, 30S-7, and 30S-8 are electrically coupled together by a base portion BA1. The p-type semiconductor layers 33 of the partial photodiodes 30S-4, 30S-5, 30S-6, 30S-7, and 30S-8 are electrically coupled together by a base portion BA2. Each of the base portions BA1 and BA2 is formed in a substantially pentagonal shape, and is provided, at the vertex positions thereof, with the partial photodiodes 30S-4, 30S-5, 30S-6, 30S-7, and 30S-8. The base portion BA2 and the p-type semiconductor layers 33 of the partial photodiodes 30S-1, 30S-2, and 30S-3 are electrically coupled together by a coupling portion CN2-3. With the above-described configuration, the partial photodiodes 30S included in one photodiode 30 are electrically coupled together.

A lower conductive layer 35 is provided in a region overlapping the partial photodiode 30S. The lower conductive layers 35 are all circular in plan view. That is, the lower conductive layer 35 may have a shape different from that of the partial photodiode 30S. For example, each of the partial photodiodes 30S-1, 30S-2, and 30S-3 has a polygonal shape in plan view and is formed on the circular lower conductive layer 35. Each of the partial photodiodes 30S-4, 30S-5, 30S-6, 30S-7, and 30S-8 has a circular shape or a semi-circular shape having a diameter smaller than that of the lower conductive layer 35 in plan view and is formed on the circular lower conductive layer 35. The lower conductive layer 35 is supplied with the reference potential VCOM that is the same as the potential of the p-type semiconductor layer 33, and thus, can reduce parasitic capacitance between the lower conductive layer 35 and the p-type semiconductor layer 33.

An upper conductive layer 34 electrically couples together the n-type semiconductor layers 32 of the partial photodiodes 30S. The upper conductive layer 34 is electrically coupled to the transistors (not illustrated) of the array substrate 2. The upper conductive layer 34 may be provided in any manner and may be provided, for example, so as to cover a portion of the partial photodiode 30S, or so as to cover the entire partial photodiode 30S.

In the present embodiment, the partial photodiode 30S is provided for each of the lenses 78 and each of the first openings OP1. As compared with a configuration in which the photodiode 30 is formed of a solid film having, for example, a quadrilateral shape so as to cover the entire detection element 3 in plan view, this configuration can reduce the semiconductor layers and the wiring layers in a region not overlapping the lenses 78 and the first openings OP1, and therefore, can reduce the parasitic capacitance of the photodiode 30.

The planar structure of the photodiode 30 illustrated in FIG. 9 is merely an example, and can be changed as appropriate. The number of the partial photodiodes 30S included in one photodiode 30 may be seven or smaller, or nine or larger. The partial photodiodes 30S are not limited to being arranged in a triangular lattice pattern, and may be arranged in a matrix having a row-column configuration, for example. The arrangement of the lenses 78, the first openings OP1, and the second openings OP2 included in the optical filter 7 can also be changed as appropriate depending on the configuration of the partial photodiodes 30S.

Figure 10:
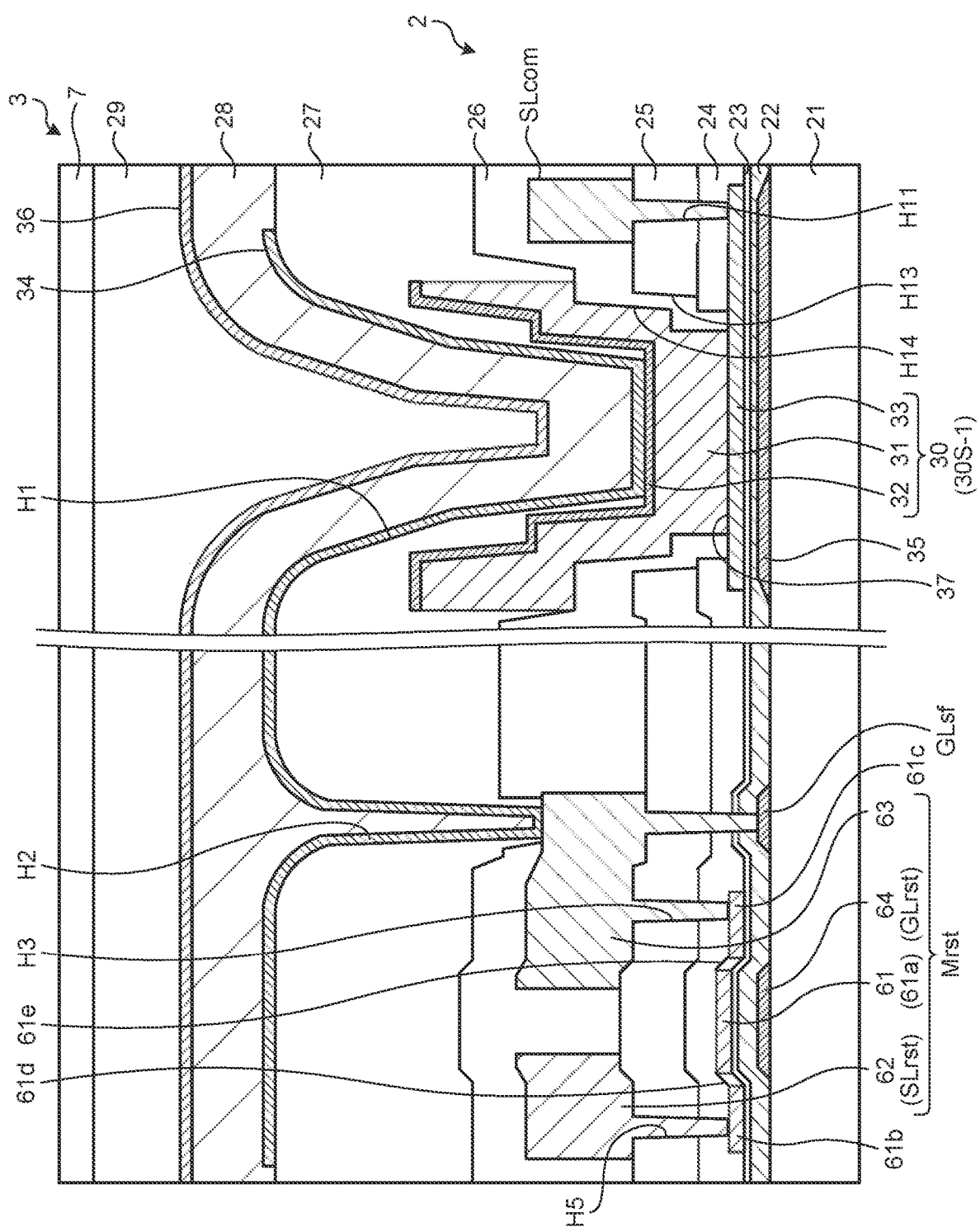
FIG. 10 is a sectional view along X-X' of FIG. 9.

FIG. 10 is a sectional view along X-X' of FIG. 9. FIG. 10 illustrates a sectional configuration of a transistor Mrst included in the detection element 3 together with a sectional configuration of the partial photodiode 30S-1.

The substrate 21 is an insulating substrate. A glass substrate of, for example, quartz or alkali-free glass, or a resin substrate of, for example, polyimide is used as the substrate 21. A gate electrode 64 is provided on the substrate 21. Insulating films 22 and 23 are provided on the substrate 21 so as to cover the gate electrode 64. The insulating films 22 and 23 and insulating films 24, 25, and 26 are inorganic insulating films and are formed of, for example, silicon oxide ($SiO_2$) or silicon nitride (SiN).

A semiconductor layer 61 is provided on the insulating film 23. For example, polysilicon is used as the semiconductor layer 61. The semiconductor layer 61 is, however, not limited thereto, but may be formed of, for example, a microcrystalline oxide semiconductor, an amorphous oxide semiconductor, or low-temperature polycrystalline silicon (LTPS). The transistor Mrst has a bottom-gate structure in which the gate electrode 64 is provided on the lower side of the semiconductor layer 61, but may have a top-gate structure in which the gate electrode 64 is provided on the upper side of the semiconductor layer 61, or a dual-gate structure in which the gate electrodes 64 are provided on the upper side and the lower side of the semiconductor layer 61.

The semiconductor layer 61 includes a channel region 61$a$, high-concentration impurity regions 61$b$ and 61$c$, and low-concentration impurity regions 61$d$ and 61$e$. The channel region 61$a$ is, for example, a non-doped intrinsic semiconductor or a low-impurity region, and has lower conductivity than that of the high-concentration impurity regions 61$b$ and 61$c$ and the low-concentration impurity regions 61$d$ and 61$e$. The channel region 61$a$ is provided in a region overlapping the gate electrode 64.

The insulating films 24 and 25 are provided on the insulating film 23 so as to cover the semiconductor layer 61. A source electrode 62 and a drain electrode 63 are provided on the insulating film 25. The source electrode 62 is coupled to the high-concentration impurity region 61$b$ of the semiconductor layer 61 through a contact hole H5. The drain electrode 63 is coupled to the high-concentration impurity region 61$c$ of the semiconductor layer 61 through a contact hole H3. The source and the drain electrodes 62 and 63 are formed of, for example, a multilayered film of Ti—Al—Ti layers or Ti—Al layers that has a multilayered structure of titanium and aluminum.

A gate line GLsf is wiring coupled to the gate of a source follower transistor Msf. The gate line GLsf is provided in the same layer as that of the gate electrode 64. The drain electrode 63 (coupling wiring SLcn) is coupled to the gate line GLsf through a contact hole passing through the insulating films 22 to 25.

The following describes a sectional configuration of the photodiode 30. Although the partial photodiode 30S-1 will be described with reference to FIG. 10, the description of the partial photodiode 30S-1 is also applicable to the other partial photodiodes 30S-2, . . . , 30S-8. As illustrated in FIG. 10, the lower conductive layer 35 is provided in the same layer as that of the gate electrode 64 and the gate line GLsf on the substrate 21. The insulating films 22 and 23 are provided on the lower conductive layer 35. The photodiode 30 is provided on the insulating film 23, and the lower conductive layer 35 is provided between the substrate 21 and the p-type semiconductor layer 33. The lower conductive layer 35 is formed of the same material as that of the gate electrode 64 to serve as a light-blocking layer, and thus, the lower conductive layer 35 can restrain light from entering the photodiode 30 from the substrate 21 side.

The i-type semiconductor layer 31 is provided between the p-type semiconductor layer 33 and the n-type semiconductor layer 32 in the third direction Dz. In the present embodiment, the p-type semiconductor layer 33, the i-type semiconductor layer 31, and the n-type semiconductor layer 32 are stacked in this order on the insulating film 23. The effective sensing region 37 illustrated in FIG. 9 is a region in which the i-type semiconductor layer 31 is coupled to the p-type semiconductor layer 33.

Specifically, the p-type semiconductor layer 33 is provided in the same layer as that of the semiconductor layer 61 on the insulating film 23. The insulating films 24, 25, and 26 are provided so as to cover the p-type semiconductor layer 33. The insulating films 24 and 25 are provided with a contact hole H13 in a position overlapping the p-type semiconductor layer 33. The insulating film 26 is provided above the insulating film 25 so as to cover the transistors including the transistor Mrst. The insulating film 26 covers side surfaces of the insulating films 24 and 25 that form inner walls of the contact holes H1*l* and H13. The insulating film 26 is provided with a contact hole H14 in a position overlapping the p-type semiconductor layer 33.

The i-type semiconductor layer 31 is provided on the insulating film 26 and is coupled to the p-type semiconductor layer 33 through the contact hole H14 passing through the insulating films 24 to 26. The n-type semiconductor layer 32 is provided on the i-type semiconductor layer 31.

An insulating film 27 is provided on the insulating film 26 so as to cover the photodiode 30. The insulating film 27 is provided so as to be in direct contact with the photodiode 30 and the insulating film 26. The insulating film 27 is formed of an organic material such as a photosensitive acrylic. The insulating film 27 is thicker than the insulating film 26. The insulating film 27 has a better step covering property than that of inorganic insulating materials and is provided so as to cover side surfaces of the i-type semiconductor layer 31 and the n-type semiconductor layer 32.

The upper conductive layer 34 is provided on the insulating film 27. The upper conductive layer 34 is formed of, for example, a light-transmitting conductive material such as indium tin oxide (ITO). The upper conductive layer 34 is provided along a surface of the insulating film 27 and is coupled to the n-type semiconductor layer 32 through a contact hole H1 provided in the insulating film 27. The upper conductive layer 34 is electrically coupled to the drain electrode 63 of the transistor Mrst and the gate line GLsf through a contact hole H2 provided in the insulating film 27.

An insulating film 28 is provided on the insulating film 27 so as to cover the upper conductive layer 34. The insulating film 28 is an inorganic insulating film. The insulating film 28 is provided as a protective layer for restraining water from entering the photodiode 30. An overlapping conductive layer 36 is provided on the insulating film 28. The overlapping conductive layer 36 is formed of, for example, a light-transmitting conductive material such as ITO. The overlapping conductive layer 36 need not be provided.

The protective film 29 is provided on the insulating film 28 so as to cover the overlapping conductive layer 36. The protective film 29 is an organic protective film. The protective film 29 is formed so as to planarize a surface of the detection device 1.

In the present embodiment, the p-type semiconductor layer 33 of the photodiode 30 and the lower conductive layer 35 are provided in the same layers as those of the transistors. Therefore, the manufacturing process can be simpler than in a case where the photodiode 30 is formed in layers different from those of the transistors.

The sectional configuration of the photodiode 30 illustrated in FIG. 10 is merely an example. The sectional configuration is not limited to this example. For example, the photodiode 30 may be provided in layers different from those of the transistors, or may be provided by stacking the p-type semiconductor layer 33, the i-type semiconductor layer 31, and the n-type semiconductor layer 32 in this order on the insulating film 26.

As described above, the detection device 1 of the present embodiment includes the substrate 21 (array substrate 2) having the detection region AA, the photodiodes 30 provided in the detection region AA, the first light-transmitting resin layer 74 provided so as to cover the photodiodes 30, the second light-blocking layer 72 provided on the upper side of the first light-transmitting resin layer 74 and provided with the second openings OP2 in the regions overlapping the respective photodiodes 30, the second light-transmitting resin layer 75 provided so as to cover the second light-blocking layer 72, and the lenses 78 provided on the upper side of the second light-transmitting resin layer 75 so as to overlap the respective photodiodes 30. On the peripheral side of the substrate 21 (array substrate 2), the second light-transmitting resin layer 75 is provided so as to cover the end 72*e* on the peripheral side of the second light-blocking layer 72.

With this configuration, in the optical filter 7, the second light-blocking layer 72, the first light-transmitting resin layer 74, and the second light-transmitting resin layer 75 are stacked such that at least the positions of the end 72*e* on the peripheral side of the second light-blocking layer 72 and the end 75*e* on the peripheral side of the second light-transmitting resin layer 75 are shifted from each other on the peripheral side of the array substrate 2. As a result, compared with a case where the layers are formed so as to match the positions of the ends 72*e* and 75*e* on the peripheral side of the array substrate 2, no steep step is formed and a smoother step shape is formed as a whole on the peripheral side of the array substrate 2.

That is, compared with the case where the layers are formed so as to match the positions of the ends 72*e* and 75*e*, shape variations decrease at least at the end 75*e* on the peripheral side of the second light-transmitting resin layer 75. As a result, the non-uniformity of the shapes of the optical elements (the second light-blocking layer 72 (second opening OP2) and the lenses 78) that would be caused by the shape variations at the end 75e can be reduced when the second light-blocking layer 72 and the lenses 78 are formed by coating.

Figure 11:
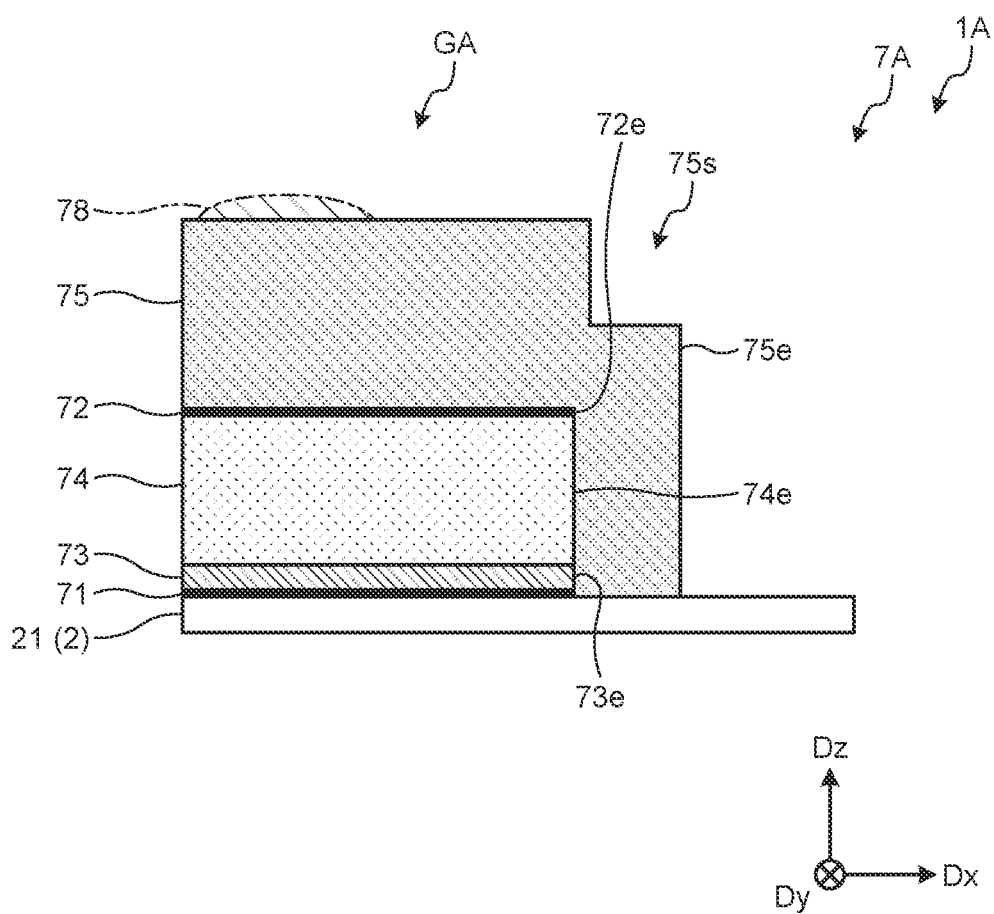
FIG. 11 is a sectional view schematically illustrating an optical filter in the peripheral region according to a fourth modification.

FIG. 11 is a sectional view schematically illustrating an optical filter in the peripheral region according to a fourth modification. In the following description, the same components as those described in the embodiment described above are denoted by the same reference numerals, and the description thereof will not be repeated.

As illustrated in FIG. 11, in a detection device 1A and an optical filter 7A according to the fourth modification, the end on the peripheral side of the first light-blocking layer 71, the end 73e on the peripheral side of the filter layer 73, the end 74e on the peripheral side of the first light-transmitting resin layer 74, and the end 72e on the peripheral side of the second light-blocking layer 72 are formed so as to overlap one another. The second light-transmitting resin layer 75 is provided so as to cover the end on the peripheral side of the first light-blocking layer 71, the end 72e on the peripheral side of the second light-blocking layer 72, the end 74e on the peripheral side of the first light-transmitting resin layer 74, and the end 73e on the peripheral side of the filter layer 73. The end 75e on the peripheral side of the second light-transmitting resin layer 75 is in contact with the top of the array substrate 2.

A step 75s is formed at the end 75e on the peripheral side of the second light-transmitting resin layer 75. The step 75s is formed by transferring a step formed by a surface of the array substrate 2, the first light-blocking layer 71, the filter layer 73, the first light-transmitting resin layer 74, and the second light-blocking layer 72.

The step shape of the end 75e on the peripheral side of the second light-transmitting resin layer 75 on the peripheral side of the array substrate 2 is formed smoother than in the case where the layers are formed so as to match the positions of the ends 72e, 73e, 74e, and 75e on the peripheral side of the array substrate 2. As a result, the non-uniformity of the shapes of the lenses 78 caused by the shape variations at the end 75e can be reduced when the lenses 78 are formed by coating.

Figure 12:
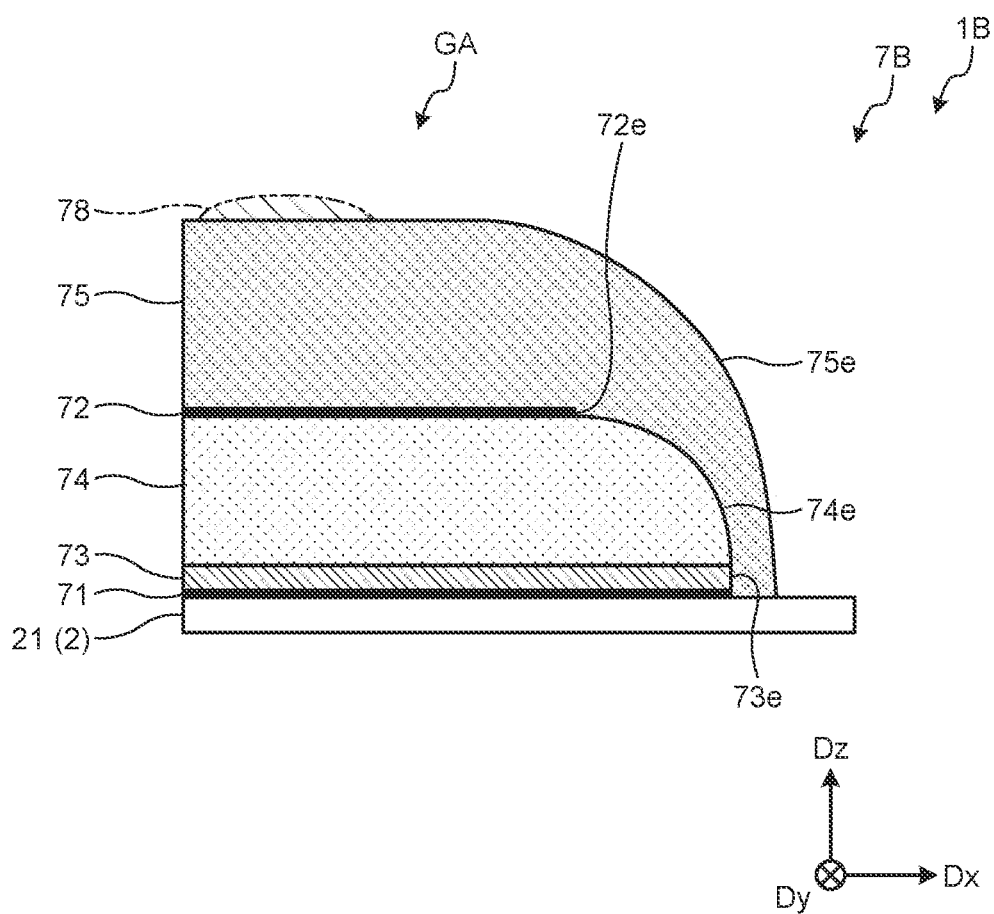
FIG. 12 is a sectional view schematically illustrating an optical filter in the peripheral region according to a fifth modification.

FIG. 12 is a sectional view schematically illustrating an optical filter in the peripheral region according to a fifth modification. As illustrated in FIG. 12, in a detection device 1B and an optical filter 7B according to the fifth modification, the end 74e on the peripheral side of the first light-transmitting resin layer 74 and the end 75e on the peripheral side of the second light-transmitting resin layer 75 are formed in a sloping manner. In more detail, the end 74e on the peripheral side of the first light-transmitting resin layer 74 and the end 75e on the peripheral side of the second light-transmitting resin layer 75 are each formed in a smoothly curved shape.

The second light-blocking layer 72 is provided in a flat region of the first light-transmitting resin layer 74. The end 72e on the peripheral side of the second light-blocking layer 72 is located closer to the detection region AA than the end 73e on the peripheral side of the filter layer 73 and the end 74e on the peripheral side of the first light-transmitting resin layer 74.

The second light-transmitting resin layer 75 is provided so as to cover the end 73e on the peripheral side of the filter layer 73, the end 74e on the peripheral side of the first light-transmitting resin layer 74, and the end 72e on the peripheral side of the second light-blocking layer 72. The lenses 78 are provided in a flat region of the second light-transmitting resin layer 75.

The end 74e on the peripheral side of the first light-transmitting resin layer 74 and the end 75e on the peripheral side of the second light-transmitting resin layer 75 according to the fifth modification can be formed using, for example, a halftone mask or a gray-tone mask. Alternatively, the ends 74e and 75e can be formed in a sloping manner by repeatedly applying and forming a plurality of light-transmitting resin layers having different shapes.

Figure 13:
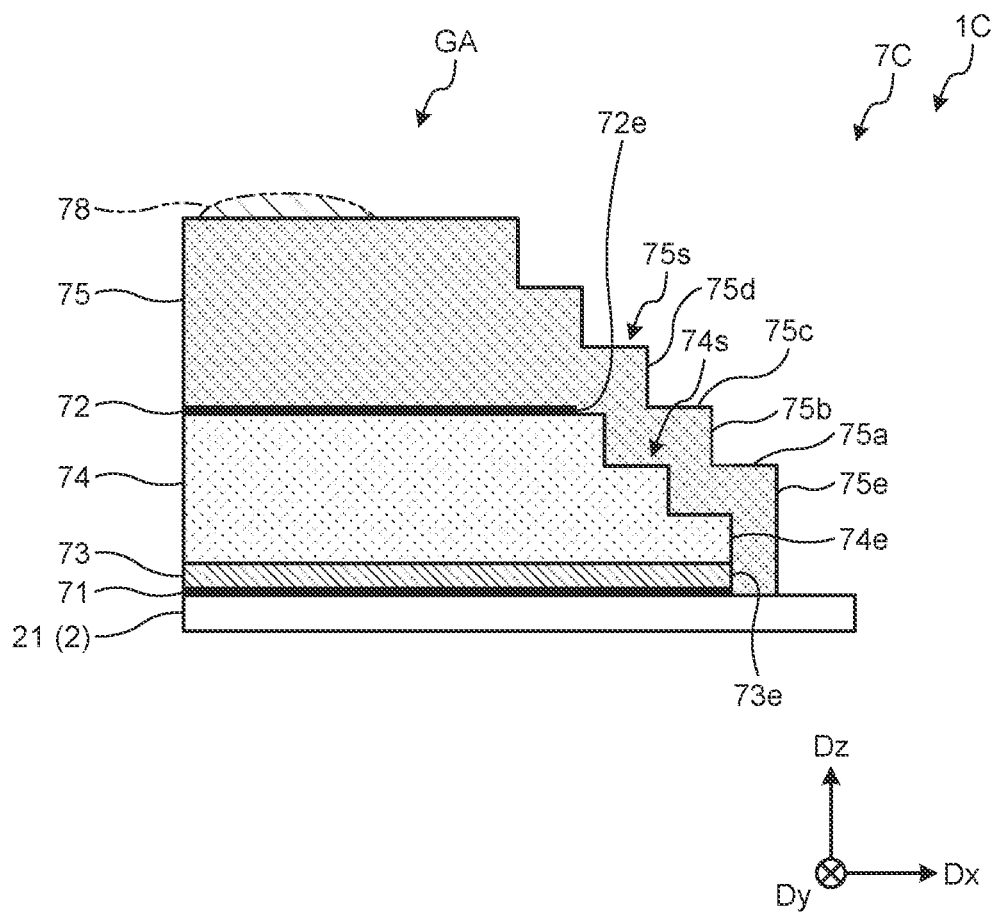
FIG. 13 is a sectional view schematically illustrating an optical filter in the peripheral region according to a sixth modification.

FIG. 13 is a sectional view schematically illustrating an optical filter in the peripheral region according to a sixth modification. As illustrated in FIG. 13, in a detection device 1C and an optical filter 7C according to the sixth modification, a plurality of steps 74s and a plurality of steps 75s are formed at the end 74e on the peripheral side of the first light-transmitting resin layer 74 and the end 75e on the peripheral side of the second light-transmitting resin layer 75, respectively. The end 74e on the peripheral side of the first light-transmitting resin layer 74 and the end 75e on the peripheral side of the second light-transmitting resin layer 75 are each formed in a stepped shape.

Specifically, the steps 75s of the second light-transmitting resin layer 75 are formed by connecting at least a first upper surface 75a, a first side surface 75b, a second upper surface 75c, and a second side surface 75d from the end 75e on the peripheral side of the second light-transmitting resin layer 75. The height of each of the steps 75s (for example, the distance between the first upper surface 75a and the second upper surface 75c in the third direction Dz) is smaller than the width of the step 75s (for example, the distance between the first side surface 75b and the second side surface 75d in the first direction Dx). As an example, the height of the step 75s is approximately 5 μm, and the width of the step 75s is approximately 40 μm. While the steps 75s of the second light-transmitting resin layer 75 have been described, the description of the steps 75s is also applicable to the steps 74s of the first light-transmitting resin layer 74. As a result, the end 74e on the peripheral side of the first light-transmitting resin layer 74 and the end 75e on the peripheral side of the second light-transmitting resin layer 75 are smoothly formed.

In the same manner as in the fifth modification (FIG. 12), the second light-blocking layer 72 is provided in a flat region of the first light-transmitting resin layer 74 where the steps 74s are not formed. The lenses 78 are provided in the flat region of the second light-transmitting resin layer 75 where the steps 75s are not formed.

The steps 74s of the first light-transmitting resin layer 74 and the steps 75s of the second light-transmitting resin layer 75 according to the sixth modification can be formed using, for example, a halftone mask or a gray-tone mask. Alternatively, the steps 74s and 75s can be formed by repeatedly applying and forming a plurality of light-transmitting resin layers having different shapes.

FIG. 13 is merely schematically illustrated. The upper surface of each of the steps 74s and 75s may be gently sloping or may be formed in a curved shape.

Figure 14:
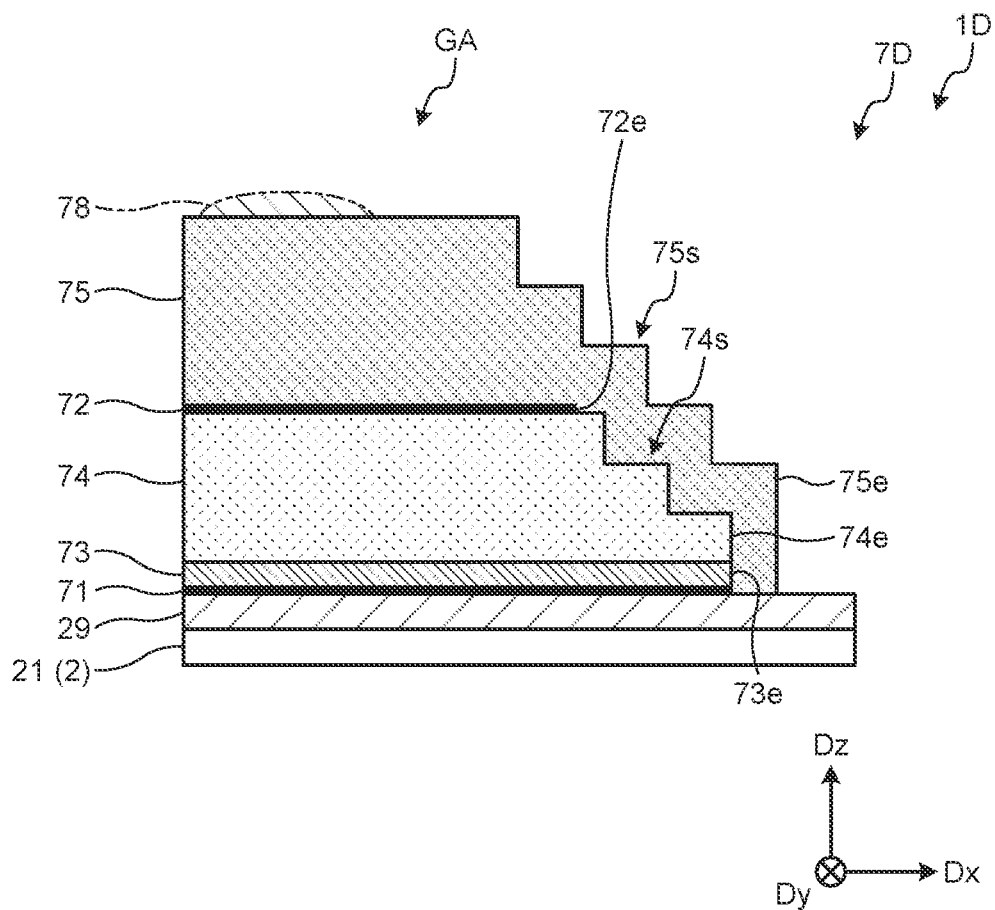
FIG. 14 is a sectional view schematically illustrating an optical filter in the peripheral region according to a seventh modification.

FIG. 14 is a sectional view schematically illustrating an optical filter in the peripheral region according to a seventh modification. As illustrated in FIG. 14, in a detection device 1D and an optical filter 7D according to the seventh modification, the protective film 29 (refer to FIG. 5) provided between the photodiodes 30 and the first light-transmitting resin layer 74 is continuously formed from the detection region AA to the end on the peripheral side of the array substrate 2. The first light-blocking layer 71, the filter layer 73, the first light-transmitting resin layer 74, the second light-blocking layer 72, and the second light-transmitting resin layer 75 are stacked on the protective film 29 on the peripheral side of the array substrate 2. The end 75e on the peripheral side of the second light-transmitting resin layer 75 is provided on the protective film 29.

The protective film 29 (organic protective film) is provided in the seventh modification. Therefore, when the steps 74s and 75s are formed using a halftone mask or a gray-tone mask, a developing solution can be restrained from penetrating below the first light-transmitting resin layer 74 and the filter layer 73. Therefore, separation of the first light-transmitting resin layer 74 and the filter layer 73 can be restrained.

In the seventh modification, the configuration has been described in which the steps 74s and 75s are formed at the end 74e on the peripheral side of the first light-transmitting resin layer 74 and the end 75e on the peripheral side of the second light-transmitting resin layer 75, respectively. However, this configuration is not limited to the seventh modification and is also applicable to the embodiment, the fourth modification, and the fifth modification described above.

Figure 15:
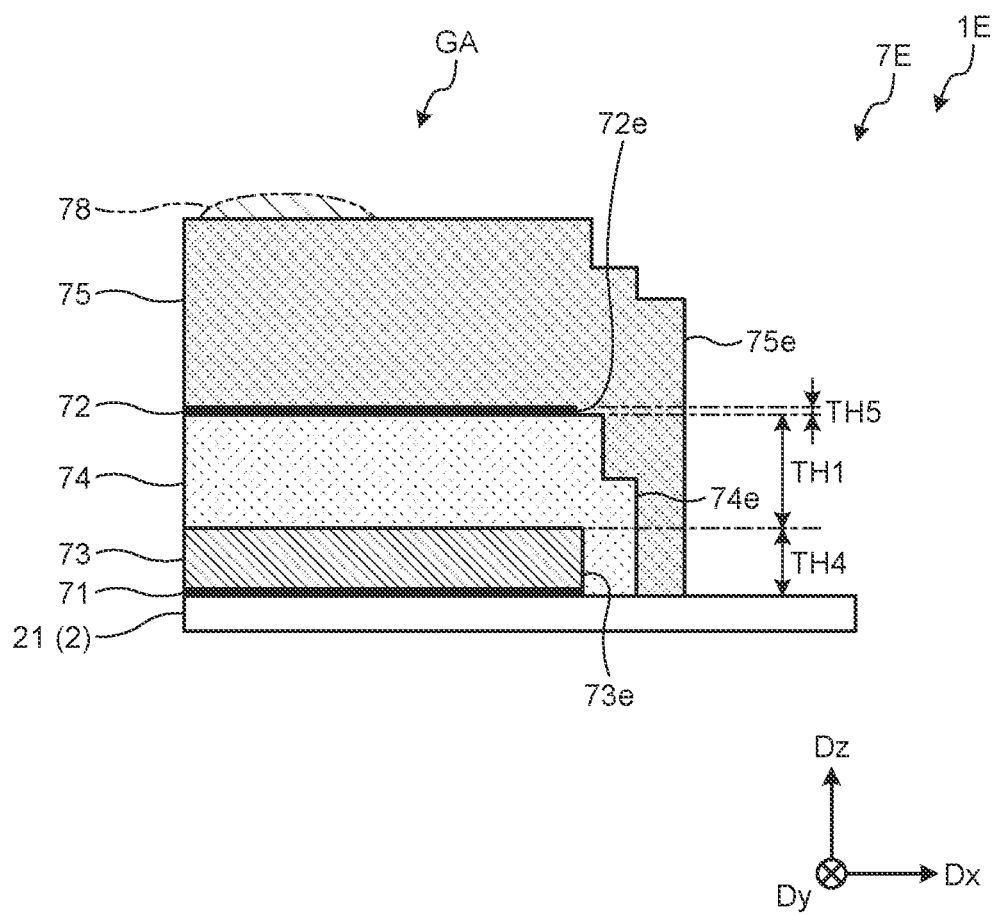
FIG. 15 is a sectional view schematically illustrating an optical filter in the peripheral region according to an eighth modification.

FIG. 15 is a sectional view schematically illustrating an optical filter in the peripheral region according to an eighth modification. As illustrated in FIG. 15, in a detection device 1E and an optical filter 7E according to the eighth modification, the thickness TH4 of the filter layer 73 is made larger than that in any of the embodiment and the fourth to seventh modifications described above.

The thickness TH4 of the filter layer 73 is made larger than the thickness TH5 of the second light-blocking layer 72. The thickness TH1 of the first light-transmitting resin layer 74 is made smaller so as to ensure the total thickness of the thickness TH1 of the first light-transmitting resin layer 74 and the thickness TH4 of the filter layer 73. The ratio of the thickness TH4 of the filter layer 73 to the total thickness (TH1+TH4) of the thickness TH1 of the first light-transmitting resin layer 74 and the thickness TH4 of the filter layer 73 is approximately 50% or lower.

In the eighth modification, by increasing the thickness TH4 of the filter layer 73, the thickness TH1 of the first light-transmitting resin layer 74 can be reduced while ensuring the total thickness of the thickness TH1 of the first light-transmitting resin layer 74 and the thickness TH4 of the filter layer 73 (that is, the distance in the third direction Dz between the first light-blocking layer 71 and the second light-blocking layer 72 defined by optical characteristics of the optical filter 7E). Therefore, the step at the end 74e on the peripheral side of the first light-transmitting resin layer 74 can be made smaller. As a result, the shape stability of the second opening OP2 of the second light-blocking layer 72 formed on the first light-transmitting resin layer 74 can be improved.

Figure 16:
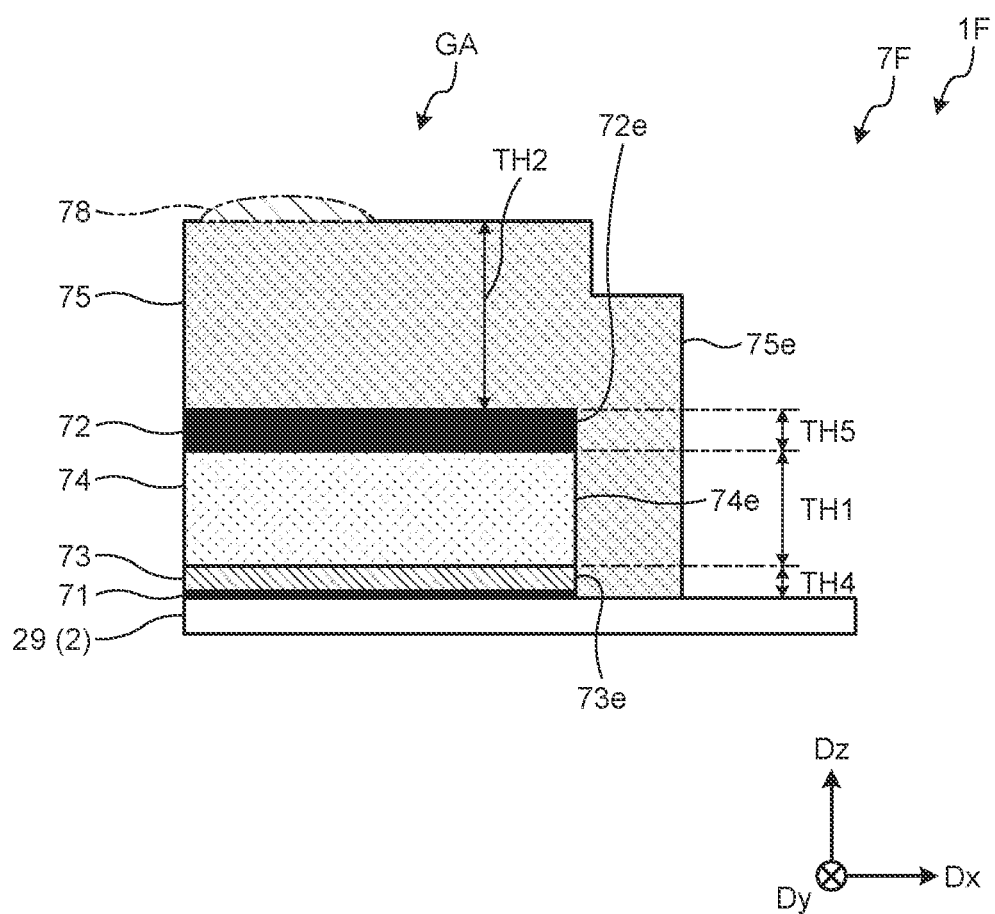
FIG. 16 is a sectional view schematically illustrating an optical filter in the peripheral region according to a ninth modification.

FIG. 16 is a sectional view schematically illustrating an optical filter in the peripheral region according to a ninth modification. As illustrated in FIG. 16, in a detection device 1F and an optical filter 7F according to the ninth modification, the thickness TH5 of the second light-blocking layer 72 is made larger than that in the embodiment and the fourth to eighth modifications described above.

The thickness TH5 of the second light-blocking layer 72 is made larger than the thickness TH4 of the filter layer 73. The thickness TH1 of the first light-transmitting resin layer 74 is made smaller so as to ensure the total thickness of the thickness TH1 of the first light-transmitting resin layer 74 and the thickness TH5 of the second light-blocking layer 72. Even when the thickness TH5 of the second light-blocking layer 72 is made larger, the thickness TH2 of the second light-transmitting resin layer 75 (that is, the distance in the third direction Dz between the lens 78 and the second light-blocking layer 72) is ensured.

Since the thickness TH1 of the first light-transmitting resin layer 74 can be made smaller by the amount of increase in the thickness TH5 of the second light-blocking layer 72, the step at the end 74e on the peripheral side of the first light-transmitting resin layer 74 can be made smaller. As a result, the shape stability of the second opening OP2 of the second light-blocking layer 72 formed on the first light-transmitting resin layer 74 can be improved. In addition, since the thickness TH5 of the second light-blocking layer 72 is made larger, variations in thickness of the second light-blocking layer 72 can be made relatively smaller.

Figure 17:
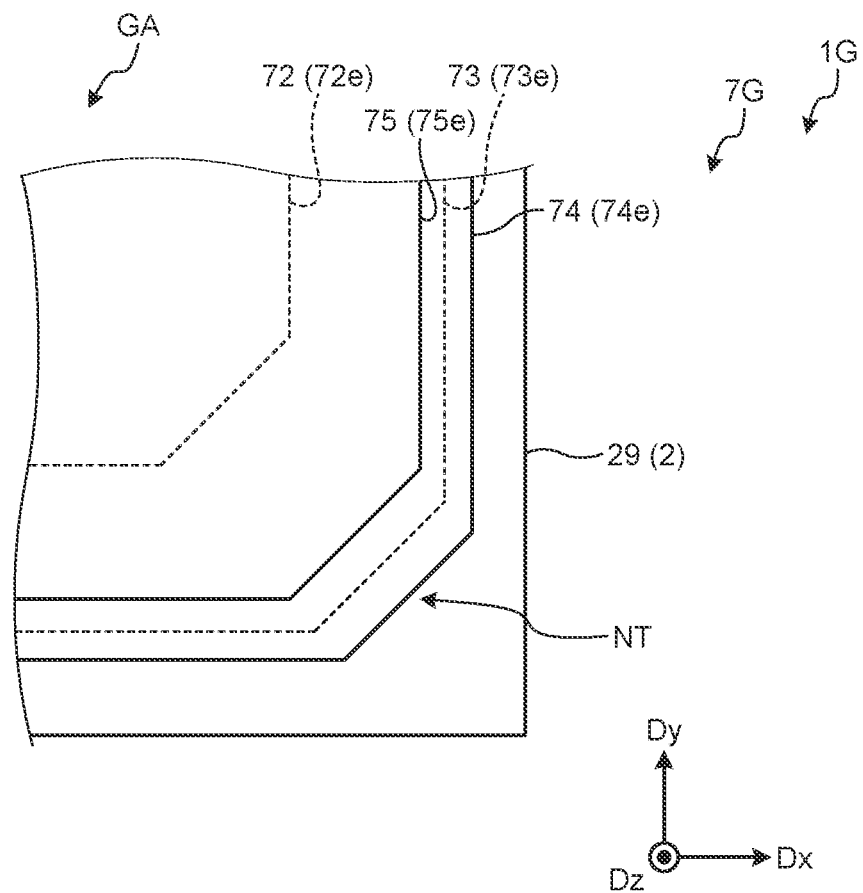
FIG. 17 is a plan view schematically illustrating an optical filter in the peripheral region according to a tenth modification.

FIG. 17 is a plan view schematically illustrating an optical filter in the peripheral region according to a tenth modification. As illustrated in FIG. 17, in a detection device 1G and an optical filter 7G according to the tenth modification, a chamfered portion NT is formed at a corner on the peripheral side of the first light-transmitting resin layer 74 and a corner on the peripheral side of the second light-transmitting resin layer 75 in plan view. The chamfered portion NT extends in an oblique direction intersecting the first direction Dx and the second direction Dy and connects the ends 74e and 75e extending in the first direction Dx to the ends 74e and 75e extending in the second direction Dy.

Figure 18:
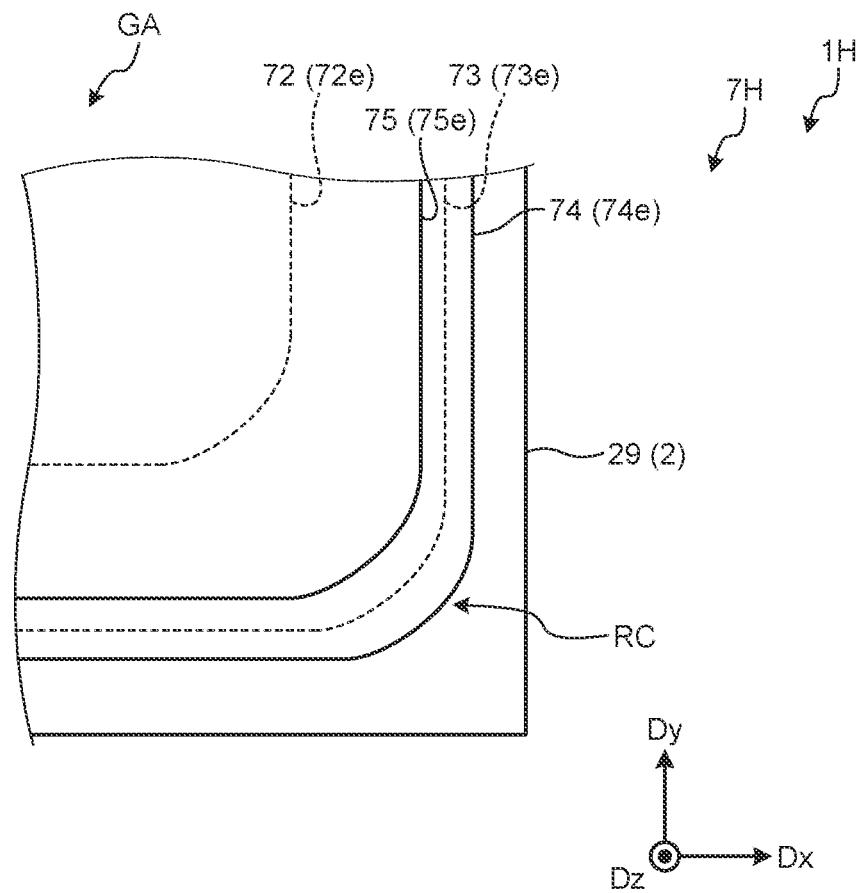
FIG. 18 is a plan view schematically illustrating an optical filter in the peripheral region according to an eleventh modification.

FIG. 18 is a plan view schematically illustrating an optical filter in the peripheral region according to an eleventh modification. As illustrated in FIG. 18, in a detection device 1H and an optical filter 7H according to the eleventh modification, a rounded portion RC is formed at the corner on the peripheral side of the first light-transmitting resin layer 74 and the corner on the peripheral side of the second light-transmitting resin layer 75 in plan view. The rounded portion RC is formed in a curved shape and smoothly connects the ends 74e and 75e extending in the first direction Dx to the ends 74e and 75e extending in the second direction Dy.

In the tenth and eleventh modifications, providing the chamfered portion NT and the rounded portion RC can reduce variations in shape of the steps at the corner on the peripheral side of the first light-transmitting resin layer 74 and the corner on the peripheral side of the second light-transmitting resin layer 75, compared with a case where the corner is formed by connecting the ends 74e and 75e extending in the first direction Dx to the ends 74e and 75e extending in the second direction Dy at right angles.

FIGS. 17 and 18 illustrate the configuration in which the chamfered portion NT or the rounded portion RC is formed at both the corner on the peripheral side of the first light-transmitting resin layer 74 and the corner on the peripheral side of the second light-transmitting resin layer 75, but the configuration is not limited to these illustrations. The chamfered portion NT or the rounded portion RC may be formed at least at one of the corner on the peripheral side of the first light-transmitting resin layer 74 and the corner on the peripheral side of the second light-transmitting resin layer 75. The chamfered portion NT or the rounded portion RC is also formed in the second light-blocking layer 72 and the filter layer 73. However, the chamfered portion NT or the rounded portion RC need not be formed in the second light-blocking layer 72 and the filter layer 73.

The configuration of the tenth modification or the eleventh modification can be combined with that of any one of the embodiment and the first to ninth modifications described above.

Figure 19:
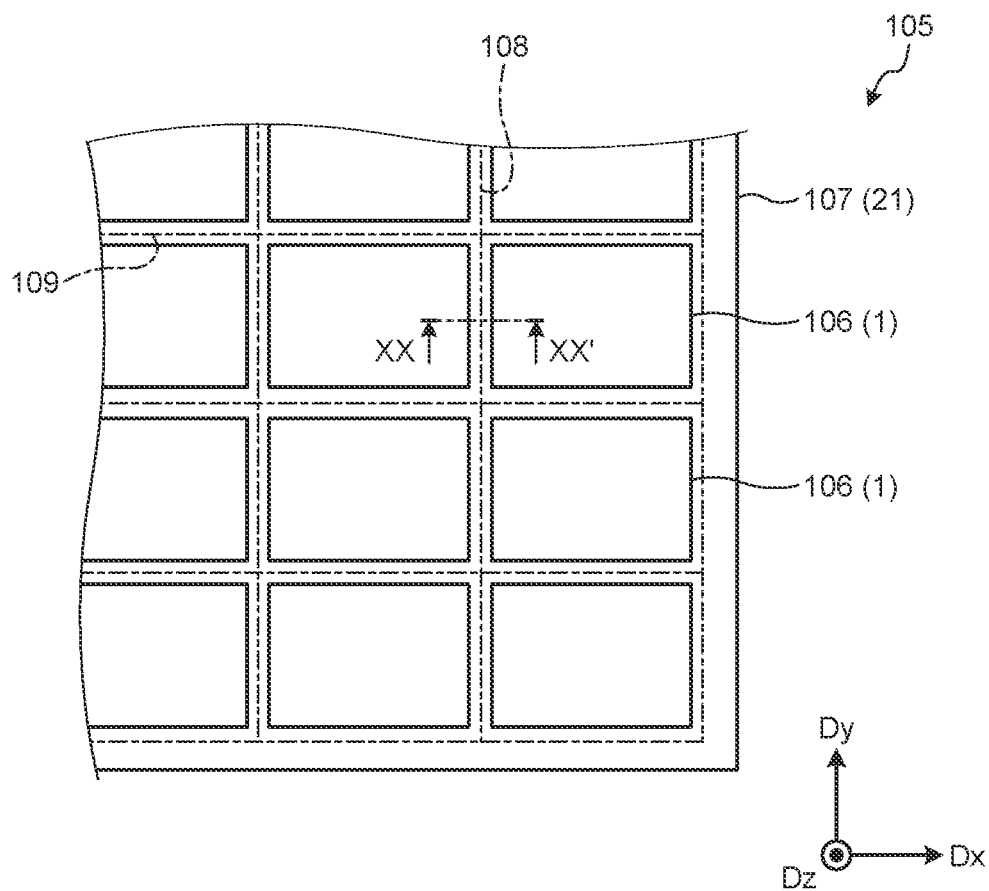
FIG. 19 is a plan view schematically illustrating a motherboard according to a twelfth modification.

FIG. 19 is a plan view schematically illustrating a motherboard according to a twelfth modification. FIG. 20 is a sectional view along XX-XX' of FIG. 19. As illustrated in FIG. 19, a motherboard 105 has a plurality of sensing regions 106. The sensing regions 106 are arranged in the first direction Dx and the second direction Dy. The sensing regions 106 are regions each to be formed as the detection device 1 (array substrate 2) when divided into dice along dividing lines 108 and 109. That is, a multilayered structure from the substrate 107 (21) to the optical filter 7 and the projections PS (refer to FIG. 5) is formed on the motherboard 105 and includes the transistors, the various types of wiring, and the photodiodes 30.

As illustrated in FIG. 20, in the sensing regions 106 adjacent in the first direction Dx, the first light-blocking layer 71, the second light-blocking layer 72, and the filter layer 73 are provided for each of the sensing regions 106, and are not provided in a region overlapping any of the dividing lines 108.

The first light-transmitting resin layer 74 is provided over the sensing regions 106 adjacent in the first direction Dx, and a groove 74g is formed in the region overlapping the dividing line 108. The second light-transmitting resin layer 75 is provided for each of the sensing regions 106 and covers the inner wall of the groove 74g. The second light-transmitting resin layer 75 is not formed at least in the region overlapping the dividing line 108. Since the groove 74g is provided in the present modification, good cuttability of the motherboard 105 along the dividing line 108 can be ensured. The step at the end 74e on the peripheral side of the first light-transmitting resin layer 74 (refer to FIG. 15, for example) formed by the cutting along the dividing line 108 can also be made smaller.

While FIG. 20 illustrates the sectional view intersecting the dividing line 108 (sectional view seen in the second direction Dy), a section intersecting the dividing line 109 also has the same configuration. That is, the grooves 74g are provided in a grid pattern along the dividing lines 108 and 109.

While the preferred embodiment of the present disclosure has been described above, the present disclosure is not limited to the embodiment described above. The content disclosed in the embodiment is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiment and the modifications described above.

What is claimed is:

1. A detection device comprising:
a substrate having a detection region;
a plurality of photodiodes provided in the detection region;
a first light-transmitting resin layer provided so as to cover the photodiodes;
a light-blocking layer provided on the upper side of the first light-transmitting resin layer and provided with openings in regions overlapping the respective photodiodes;
a second light-transmitting resin layer provided so as to cover the light-blocking layer;
a plurality of lenses provided on the upper side of the second light-transmitting resin layer so as to overlap the respective photodiodes, and an infrared (IR) cut filter layer provided between the photodiodes and the first light-transmitting resin layer and configured to block infrared rays, wherein
the second light-transmitting resin layer is provided so as to cover an end on a peripheral side of the light-blocking layer on a peripheral side of the substrate
the first light-transmitting resin layer, the light-blocking layer, the second light-transmitting resin layer, and the lenses are stacked on the IR cut filter, and
the first light-transmitting resin layer is provided so as to cover an end on a peripheral side of the IR cut filter.

2. The detection device according to claim 1, wherein the second light-transmitting resin layer is provided so as to cover the end on the peripheral side of the light-blocking layer and an end on a peripheral side of the first light-transmitting resin layer.

3. The detection device according to claim 1, wherein an end on a peripheral side of the first light-transmitting resin layer and an end on a peripheral side of the second light-transmitting resin layer are formed in a sloping manner.

4. The detection device according to claim 1, wherein a plurality of steps are formed at each of an end on a peripheral side of the first light-transmitting resin layer and an end on a peripheral side of the second light-transmitting resin layer.

5. The detection device according to claim 4, wherein
the steps of the second light-transmitting resin layer are formed by connecting at least a first upper surface, a first side surface, a second upper surface, and a second side surface from the end on the peripheral side of the second light-transmitting resin layer, and
a height of each of the steps is smaller than a width of the step.

6. The detection device according to claim 1, further comprising an organic protective film provided between the photodiodes and the first light-transmitting resin layer, wherein
the organic protective film is continuously formed from the detection region to an end on the peripheral side of the substrate, and
an end on a peripheral side of the first light-transmitting resin layer is provided on the upper side of the organic protective film.

7. The detection device according to claim 1, wherein a thickness of the IR cut filter is made larger than a thickness of the light-blocking layer.

8. The detection device according to claim 1, wherein a thickness of the light-blocking layer is made larger than a thickness of the IR cut filter.

9. The detection device according to claim 1, wherein, in plan view in a direction orthogonal to the substrate, a chamfered or rounded portion is formed at least at one of a corner on a peripheral side of the first light-transmitting resin layer and a corner on a peripheral side of the second light-transmitting resin layer.

10. The detection device according to claim 1, wherein an end on a peripheral side of the first light-transmitting resin layer, an end on a peripheral side of the second light-transmitting resin layer, and the end on the peripheral side of the light-blocking layer are arranged in the order as listed, from an end on the peripheral side of the substrate toward the detection region.

11. An optical filter provided in a detection device including a substrate having a detection region and a plurality of photodiodes provided in the detection region, the optical filter comprising:

a first light-transmitting resin layer;

a light-blocking layer provided on the upper side of the first light-transmitting resin layer and provided with a plurality of openings;

a second light-transmitting resin layer provided so as to cover the light-blocking layer;

a plurality of lenses provided on the upper side of the second light-transmitting resin layer, and an infrared (IR) cut filter layer provided between the photodiodes and the first light-transmitting resin layer and configured to block infrared rays, wherein the second light-transmitting resin layer is provided so as to cover an end on a peripheral side of the light-blocking layer on a peripheral side of the first light-transmitting resin layer, the first light-transmitting resin layer, the light-blocking layer, the second light-transmitting resin layer, and the lenses are stacked on the IR cut filter, and the first light-transmitting resin layer is provided so as to cover an end on a peripheral side of the IR cut filter.

* * * * *